US011652447B2

(12) United States Patent
Buckwalter et al.

(10) Patent No.: US 11,652,447 B2
(45) Date of Patent: May 16, 2023

(54) POWER AMPLIFIER

(71) Applicant: Mixcomm, Inc., Chatham, NJ (US)

(72) Inventors: James F. Buckwalter, Santa Barbara, CA (US); Kang Ning, Santa Barbara, CA (US)

(73) Assignee: Mixcomm, Inc., Chatham, NJ (US)

( * ) Notice: Subject to any disclaimer, the term of this patent is extended or adjusted under 35 U.S.C. 154(b) by 322 days.

(21) Appl. No.: 16/993,234

(22) Filed: Aug. 13, 2020

(65) Prior Publication Data

US 2021/0050818 A1 Feb. 18, 2021

Related U.S. Application Data

(60) Provisional application No. 62/886,117, filed on Aug. 13, 2019.

(51) Int. Cl.
*H03F 1/02* (2006.01)
*H03F 3/21* (2006.01)
*H03H 7/18* (2006.01)

(52) U.S. Cl.
CPC ............ *H03F 1/0211* (2013.01); *H03F 3/211* (2013.01); *H03H 7/18* (2013.01); *H03F 2200/451* (2013.01)

(58) Field of Classification Search
CPC .. H03F 1/0211; H03F 3/211; H03F 2200/451; H03H 7/18
USPC ........................................................ 330/297
See application file for complete search history.

(56) References Cited

U.S. PATENT DOCUMENTS 9,413,309 B1 8/2016 Zhao et al.
2018/0294777 A1 10/2018 Yang et al.

FOREIGN PATENT DOCUMENTS

WO 2020166629 A1 8/2020

OTHER PUBLICATIONS

Rostomyan et al. "15 GHz Doherty Power Amplifier with RF Predistortion Linearizer in CMOS SOI", IEEE Transactions on Microwave Theory and Techniques, vol. 66, No. 3, Mar. 2018. (Year: 2018).*

(Continued)

*Primary Examiner* — Hafizur Rahman
(74) *Attorney, Agent, or Firm* — Straub & Straub; Michael P. Straub; Stephen T. Straub

(57) ABSTRACT

Methods and apparatus for implementing a power efficient amplifier device through the use of a main (primary) and auxiliary (secondary) power amplifier are described. The primary and secondary amplifiers operate as current sources providing current to the load. Capacitance coupling is used to couple the primary and secondary amplifier outputs. In some embodiments the combination of primary and secondary amplifiers achieve high average efficiency over the operating range of the device in which the primary and secondary amplifiers are used in combination as an amplifier device. The amplifier device is well suited for implementation using CMOS technology, e.g., N-MOSFETs, and can be implemented in an integrated circuit space efficient manner that is well suited for supporting RF transmissions in the GHz frequency range, e.g., 30 GHz frequency range. The primary amplifier in some embodiments is a CLASS-AB or B amplifier and the secondary amplifier is a CLASS-C amplifier.

17 Claims, 26 Drawing Sheets

(56) References Cited

OTHER PUBLICATIONS

Witte, B., "How Doherty Amplifiers improve PA efficiency", published in 5G technology world, Mar. 8, 2021 (Year: 2021).*
Xia et al., "A 28 GHz Linear Power Amplifier Based on CPW Matching Networks with Series-Connected DC-Blocking Capacitors", Published: Apr. 6, 2020, Electronics 2020, 9, 617; www.mdpi.com/journal/electronics. (Year: 2020).*
NXP application Note AN721, entitled "Impedance Matching Networks Applied to RF Power Transistors" published in 2005 (Year: 2005).*
Z. Zong et al., "A 28GHz Voltage-Combined Doherty Power Amplifier with a Compact Transformer-based Output Combiner in 22nm FD-SOI," 2020 IEEE Radio Frequency Integrated Circuits Symposium (RFIC), Los Angeles, CA, USA, 2020, pp. 299-302, doi: 10.1109/RFIC49505.2020.9218280.
J. Tsai and T. Huang, "A 38-46 GHz MMIC Doherty Power Amplifier Using Post-Distortion Linearization," in IEEE Microwave and Wireless Components Letters, vol. 17, No. 5, pp. 388-390, May 2007, doi: 10.1109/LMWC.2007.895726.
B. Wicks, E. Skafidas and R. Evans, "A 60-GHz fully-integrated Doherty power amplifier based on 0.13-μm CMOS process," 2008 IEEE Radio Frequency Integrated Circuits Symposium, Atlanta, GA, 2008, pp. 69-72, doi: 10.1109/RFIC.2008.4561388.
E. Kaymaksut, D. Zhao and P. Reynaert, "Transformer-Based Doherty Power Amplifiers for mm-Wave Applications in 40-nm CMOS," in IEEE Transactions on Microwave Theory and Techniques, vol. 63, No. 4, pp. 1186-1192, Apr. 2015, doi: 10.1109/TMTT.2015.2409255.
M. Özen, N. Rostomyan, K. Aufinger and C. Fager, "Efficient Millimeter Wave Doherty PA Design Based on a Low-Loss Combiner Synthesis Technique," in IEEE Microwave and Wireless Components Letters, vol. 27, No. 12, pp. 1143-1145, Dec. 2017, doi: 10.1109/LMWC.2017.2763739.
M. Tanio, K. Ning and J. F. Buckwalter, "A 60-GHz Symmetric Doherty Power Amplifier with 20.4% 6-dB Back-off Efficiency," 2019 49th European Microwave Conference (EuMC), Paris, France, 2019, pp. 559-562, doi: 10.23919/EuMC.2019.8910860.
A. Agah, H. Dabag, B. Hanafi, P. M. Asbeck, J. F. Buckwalter and L. E. Larson, "Active Millimeter-Wave Phase-Shift Doherty Power Amplifier in 45-nm SOI CMOS," in IEEE Journal of Solid-State Circuits, vol. 48, No. 10, pp. 2338-2350, Oct. 2013, doi: 10.1109/JSSC.2013.2269854.
H. T. Nguyen, T. Chi, S. Li and H. Wang, "A Linear High-Efficiency Millimeter-Wave CMOS Doherty Radiator Leveraging Multi-Feed On-Antenna Active Load Modulation," in IEEE Journal of Solid-State Circuits, vol. 53, No. 12, pp. 3587-3598, Dec. 2018, doi: 10.1109/JSSC.2018.2880186.
W. Hallberg, M. Özen, D. Gustafsson, K. Buisman and C. Fager, "A Doherty Power Amplifier Design Method for Improved Efficiency and Linearity," in IEEE Transactions on Microwave Theory and Techniques, vol. 64, No. 12, pp. 4491-4504, Dec. 2016, doi: 10.1109/TMTT.2016.2617882.
Notification of Transmittal of the International Search Report and the Written Opinion of the International Searching Authority, International Search Report and Written Opinion of the International Searching Authority from PCT/US2020/046254 dated Nov. 10, 2020 1-13 pages.
Rostomyan Narek et al: A Ka-Band Asymmetric Dual Input CMOS SOI Doherty Power Amplifier with 25 dBm Output Power and High Back-Off Efficiency, 2019 IEEE Topical Conference on RF/Microwave Power Amplifiers for Radio and Wireless Applications (PAWR), IEEE, Jan. 20, 2019, pp. 1-4.
Rostomyan Narek et al: 28 GHz Doherty Power Amplifier in CMOS SOI With 28% Back-Off PAE, IEEE Microwave and Wireless Components Letters, IEEE Service Center, New York, NY, US, vol. 28, No. 5, May 1, 2018, pp. 446-448.

\* cited by examiner

POWER AMPLIFIER

RELATED APPLICATIONS

The present application claims the benefit of the filing date of U.S. Provisional Patent Application Ser. No. 62/886,117 which was filed Aug. 13, 2019 and which is hereby expressly incorporated by reference in its entirety.

FIELD

The present application relates to power amplifiers and, more particularly, to radio frequency (RF) power amplifiers which are well suited for supporting both low and high power modes of operation and/or which can be implemented in a space efficient manner using field effect transistors.

BACKGROUND

Antenna arrays to support beam forming often need to be able to vary the power output to perform beam steering and/or other array dependent operations. In such applications the load corresponding to a particular antenna or set of antenna elements may be intentionally controlled to achieve the desired beam shape. As a result, as a beam is steered, the load corresponding to a particular antenna element or set of antenna elements may change, e.g., as part of the beam steering operation.

There is a need for power amplifiers which can support a varying loads at frequencies which are likely to be used for radio transmissions, e.g., in GHz frequency ranges and/or other frequency ranges.

FIG. 1 is a drawing 100 of showing one known dual input power amplifier 100 including a first power amplifier 102 and a second power amplifier 104. The dual input power amplifier uses two transistors, transistor 1 as part of the first power amplifier 102 and transistor 2 as part of the second power amplifier, to tailor performance. The dual input power amplifier 100 further includes a combiner 106 to combine the outputs from the two power amplifiers 102, 104. The specific definition of the combiner 106 determines how the individual power amplifiers (102, 104) of the dual input power amplifier 100 operate under back-off output power. Proper design of function [Zcmb], corresponding to the combiner 106, as a function of not only frequency but power levels results in high efficiency over the output power range. Specific consideration of silicon area to implement [Zcmb] is required for economic advantage. It is desirable to minimize the silicon area needed to implement the combiner, i.e., it is desirable to implement a combiner having a small footprint. It is also desirable for a combiner to operate with high efficiency and high linearity.

FIG. 2 is a drawing 200 including the general dual input power amplifier 100 of FIG. 1 and further including equations 202 defining combiner current and voltage.

FIG. 3 is a drawing 300 including the general dual input power amplifier 100 of FIG. 1 and further includes identifying information defining symbols shown within the main and auxiliary amplifiers (102, 104). β1 302 is the gain of the main amplifier 102, as indicated by box 304. β2 308 is the gain of the auxiliary amplifier 104, as indicated by box 310. Φ 312 is the phase shift of the auxiliary amplifier 104 relative to the main amplifier 102. Combiner 106 is a power combiner, as indicated by box 306. Mathematical approaches treat the values (β1, β2, and Φ) as constants.

FIG. 4 is a drawing 400 including the general dual input power amplifier 100 of FIG. 1 and further identifies that a particular combiner design 404 of the combiner 106 should be based on the device technology 402 being used in the main and auxiliary amplifiers (102, 104). There is a need for determining a "real" implementation of Zcmb which gives best performance (in terms of efficiency) for a given device technology. In particular there is a need for new methods and apparatus for dual input power amplifiers including a combiner implementation which gives best performance (in terms of efficiency) for Complementary Metal Oxide Semiconductor (CMOS) technology, particularly in the microwave frequency ranges.

FIG. 5 is a drawing 500 including the general dual input power amplifier 100 of FIG. 1 and further identifies two prior art load modulated power amplifiers, which may be the dual input power amplifier 100. The first type of prior art load modulated power amplifier is a Doherty PA 502 and the second type of prior art load modulated power amplifier is a Chireix PA 504.

FIG. 6 is a drawing 600 which is a more detailed representation of the Doherty power amplifier 502 of FIG. 5. Doherty power amplifier 502 includes a combiner 604 which includes quarter wave transmission line 602 to combine power and realize load modulation.

FIG. 7 is a drawing 700 which is a more detailed representation of the Chireix power amplifier 504 of FIG. 5. Chireix power amplifier 504 includes a combiner which includes two quarter wave transmission lines 704, 706 to combine power and realize load modulation.

Earlier work in the field of Load Modulated Power Amplifiers, e.g., a Doherty PA, uses quarter-wave transmission lines to combine power and realize load modulation. This approach is not feasible with a CMOS integrated solution. In addition to the problem of size, e.g. the transmission lines are relatively large and would take up an unacceptable amount of real estate on the circuit board, there are several other problems (gain compression, phase change across power, and power added efficiency (PAE) under backoff conditions) to consider when using CMOS technology in a dual input power amplifier.

FIG. 8 is a drawing 800 including the general dual input power amplifier 100 of FIG. 1 and describes in box 802 a first load modulated power amp issue: the gain at high power drops near compression due to auxiliary power amp gain (β2) 308.

FIG. 9 is a drawing 900 including the general dual input power amplifier 100 of FIG. 1 and describes in box 902 a second load modulated power amp issue: phase adjustment is needed to match current at the output as the auxiliary PA turns on due to behavior of the PA. FIG. 10 is a drawing 1000 including the general dual input power amplifier 100 of FIG. 1 and describes in box 1006 a third load modulated power amp issue: main and auxiliary impedances, represented by arrows 1102, 1104, change with power level to fix power-added efficiency.

A drawback of using numerous transmission lines to implement a power amplifier is the space such transmission lines occupy. It would be desirable if in at least some embodiments the use of transmission lines could be reduced or avoided as compared to the known systems.

Based on the above discussion, there is a need for new methods and apparatus for power amplifiers which are well suited for the transmission frequency ranges that are likely to be used, e.g., GHz frequency ranges and that such power amplifiers be capable of being implemented in a space efficient manner and/or capable of providing good power efficiency over a range of amplifier power ranges.

SUMMARY

Methods and apparatus for implementing a power efficient amplifier device through the use of a main (primary) and auxiliary (secondary) power amplifier are described. The primary and secondary amplifiers operate as current sources providing current to the load. Capacitance coupling is used to couple the primary and secondary amplifier outputs. In some embodiments the combination of primary and secondary amplifiers achieve high average efficiency over the operating range of the device in which the primary and secondary amplifiers are used in combination as an amplifier device. The amplifier device is well suited for implementation using CMOS technology, e.g., N-MOS-FETs, and can be implemented in an integrated circuit space efficient manner that is well suited for supporting RF transmissions in the GHz frequency range, e.g., 30 GHz frequency range. The primary amplifier in some embodiments is a CLASS-AB or B amplifier and the secondary amplifier is a CLASS-C amplifier.

Transmission lines as part of the power amplifier are avoided in some but not necessarily all embodiments. While a transmission line is used at an input to one of the amplifiers in some embodiments transmission lines as part of the output of the power amplifier device are avoided. The amplifiers are well suited in transmission arrays where the load of the amplifier corresponds to an antenna element or set of antenna elements and beam steering may be implemented.

An exemplary dual input power amplifier, in accordance with some embodiments of the present invention, includes a combiner with high efficiency and improved linearity, over existing approaches, and can be implemented in a small footprint in comparison to existing approaches which rely on long transmission lines to combine power and realize load modulation.

The values of: i) the gain of the main power amplifier ($\beta 1$), ii) the gain of the auxiliary power amplifier ($\beta 1$) and iii) the phase of the auxiliary power amplifier ($\Phi$) are not in fact constant, but in reality are actually changing with power which is very important to get a performance improvement in a Complementary Metal Oxide Semiconductor (CMOS) Monolithic Microwave Integrated Circuit (MMIC).

While various features discussed in the summary are used in some embodiments it should be appreciated that not all features are required or necessary for all embodiments and the mention of features in the summary should in no way be interpreted as implying that the feature is necessary or critical for all embodiments.

Numerous additional features and embodiments are discussed in the detailed description which follows.

DETAILED DESCRIPTION

In accordance with a feature of various embodiments of the present invention, both main and auxiliary amplifiers of a dual input power amplifier operate as current sources directly at the load and achieve high average efficiency. This approach of having both the main and auxiliary amplifiers of a dual input power amplifier operate as current sources directly at the load is not the Doherty approach, which uses long transmission lines to combine power.

Figure 1:
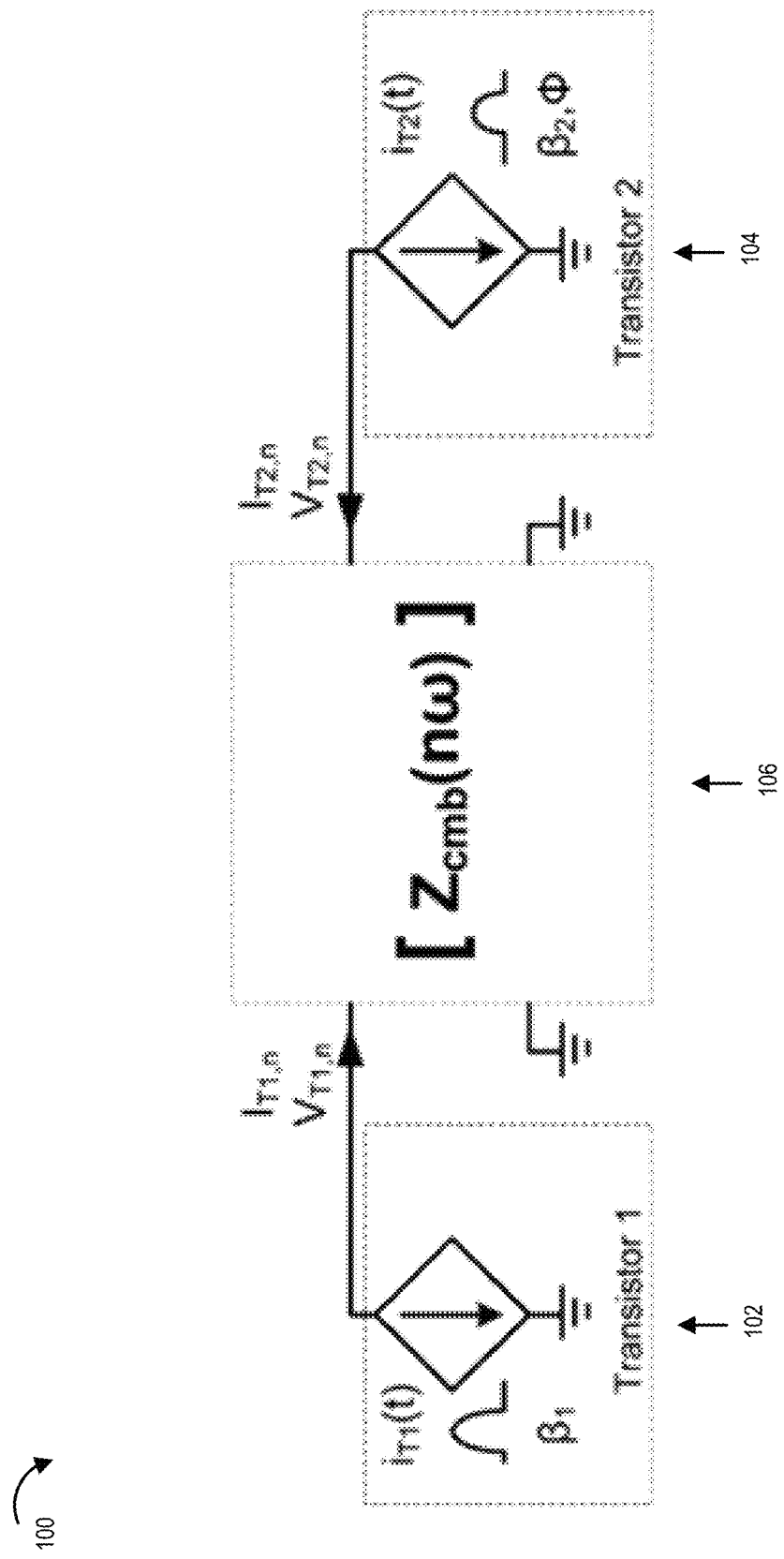
FIG. 1 is a drawing of a general dual input power amplifier including a first power amplifier, a second power amplifier and a combiner.
Figure 2:
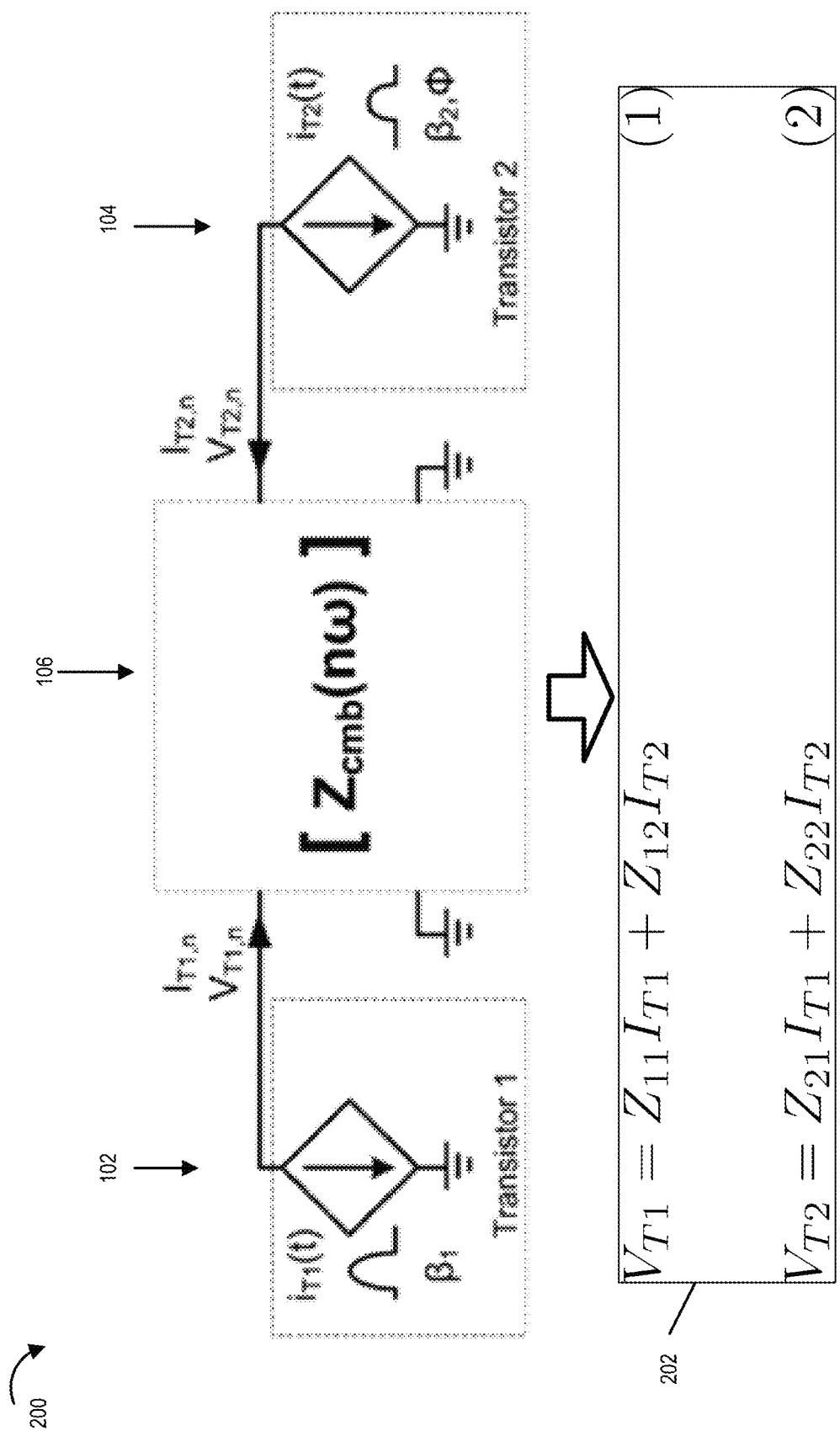
FIG. 2 is a drawing including the general dual input power amplifier of FIG. 1 and further including equations defining combiner current and voltage.
Figure 3:
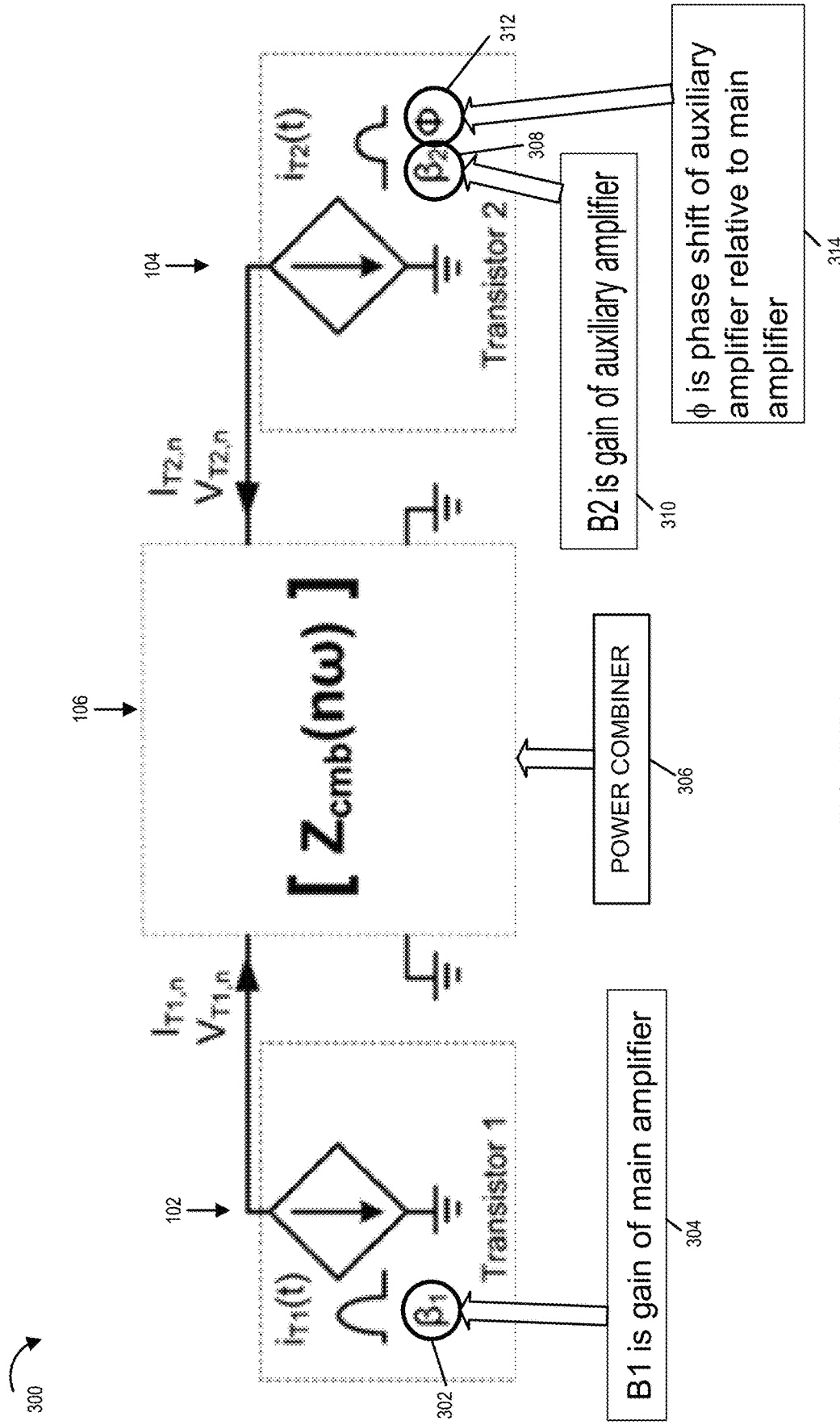
FIG. 3 is a drawing including the general dual input power amplifier of FIG. 1 and further includes identifying information defining symbols shown within the main and auxiliary amplifiers.
Figure 4:
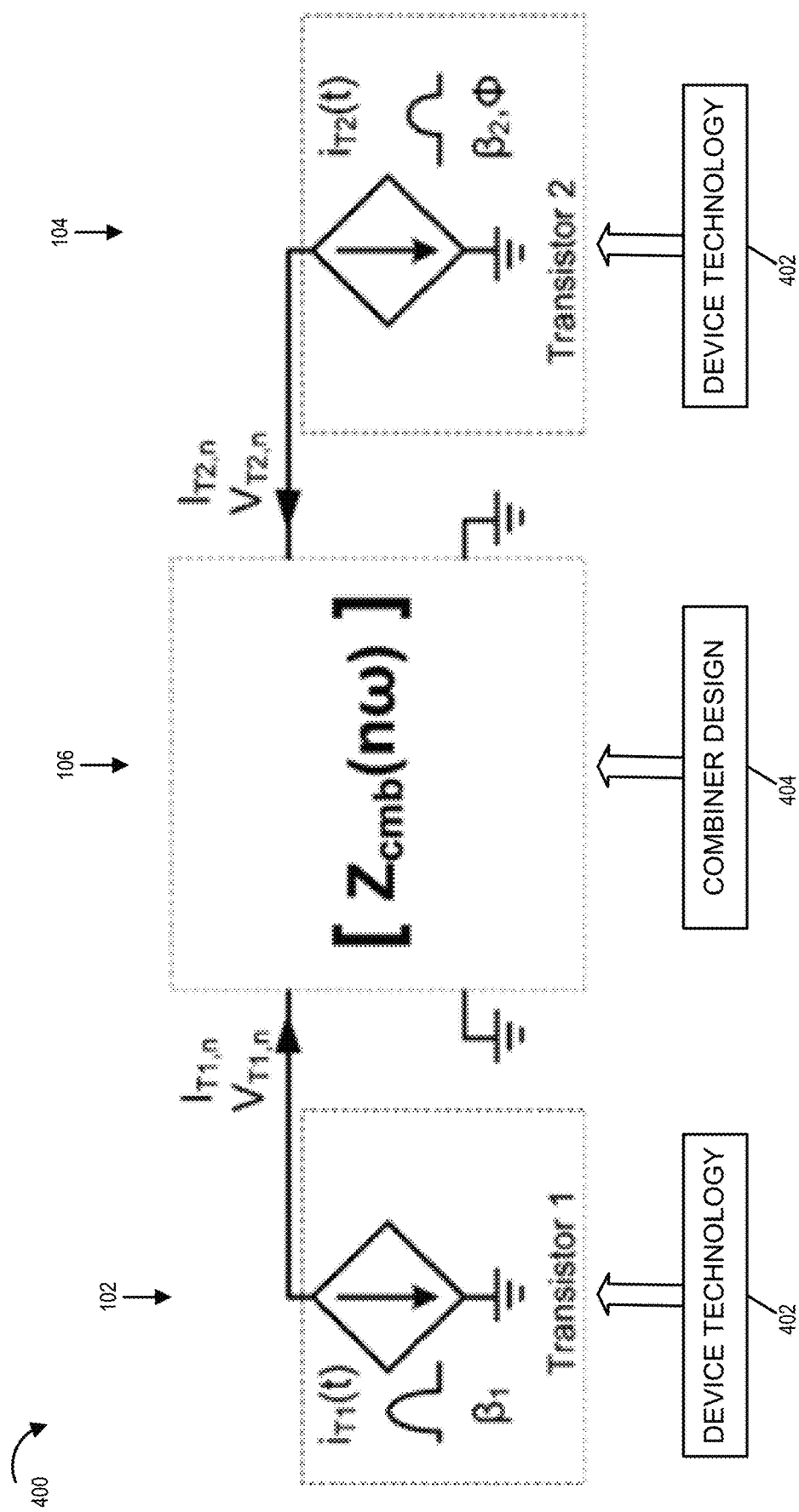
FIG. 4 is a drawing including the general dual input power amplifier of FIG. 1 and further identifies that a particular combiner design of the combiner should be based on the device technology being used in the main and auxiliary amplifiers.
Figure 5:
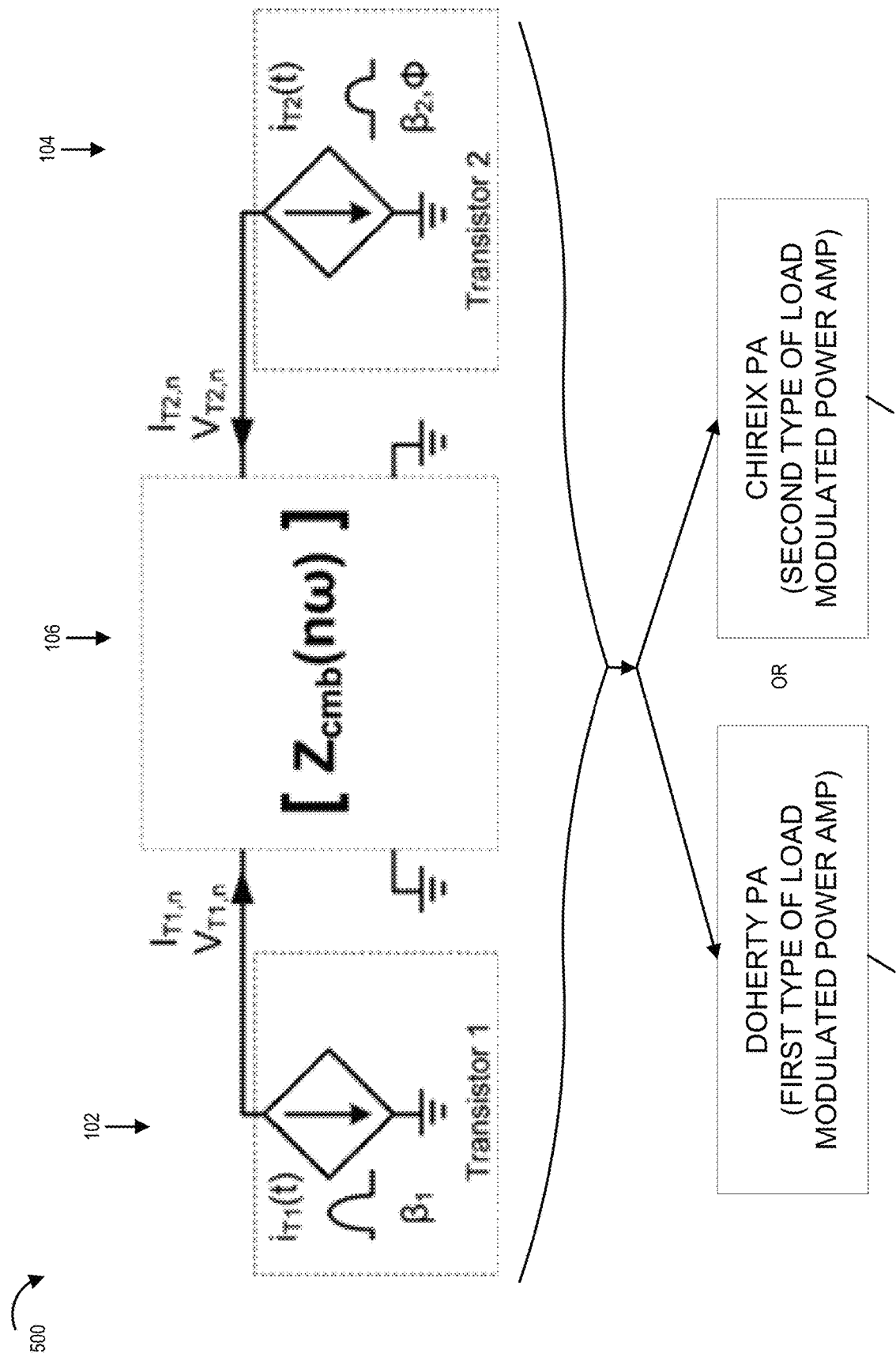
FIG. 5 is a drawing including the general dual input power amplifier of FIG. 1 and further identifies two prior art load modulated power amplifiers, which may be the dual input power amplifier.
Figure 6:
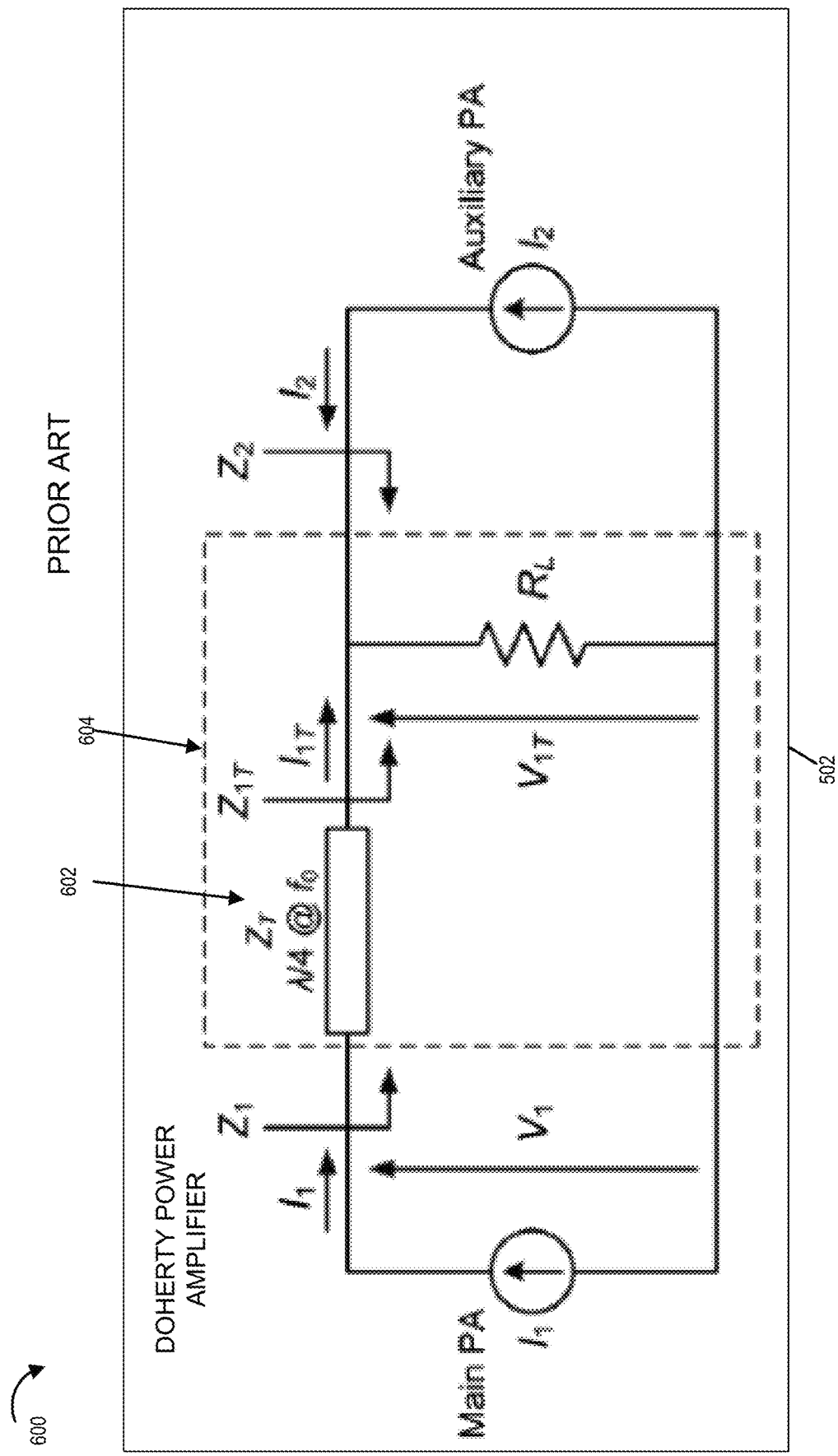
FIG. 6 is a drawing which is a more detailed representation of the Doherty power amplifier of Figure.
Figure 7:
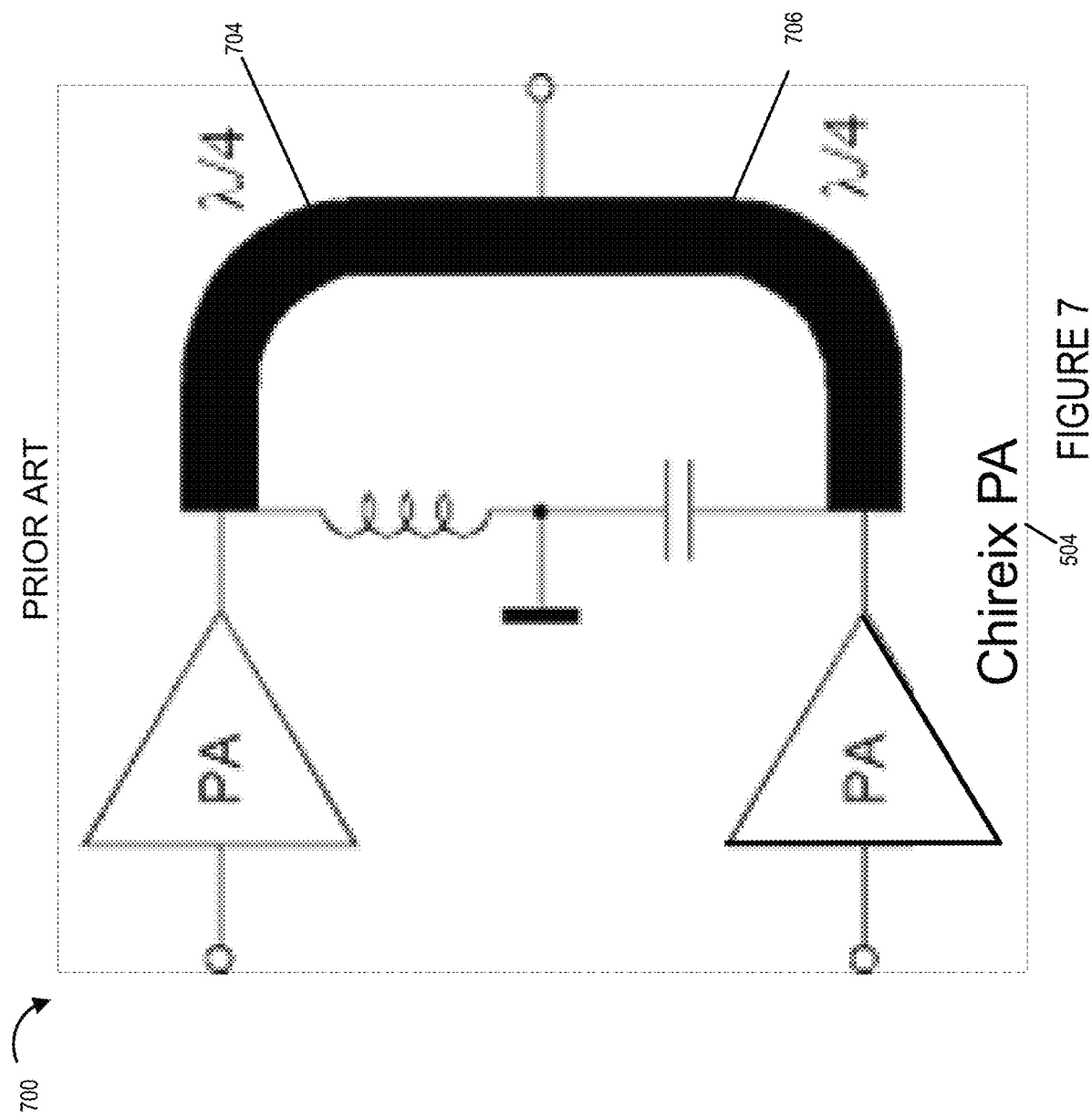
FIG. 7 is a drawing which is a more detailed representation of the Chireix power amplifier of FIG. 5.
Figure 8:
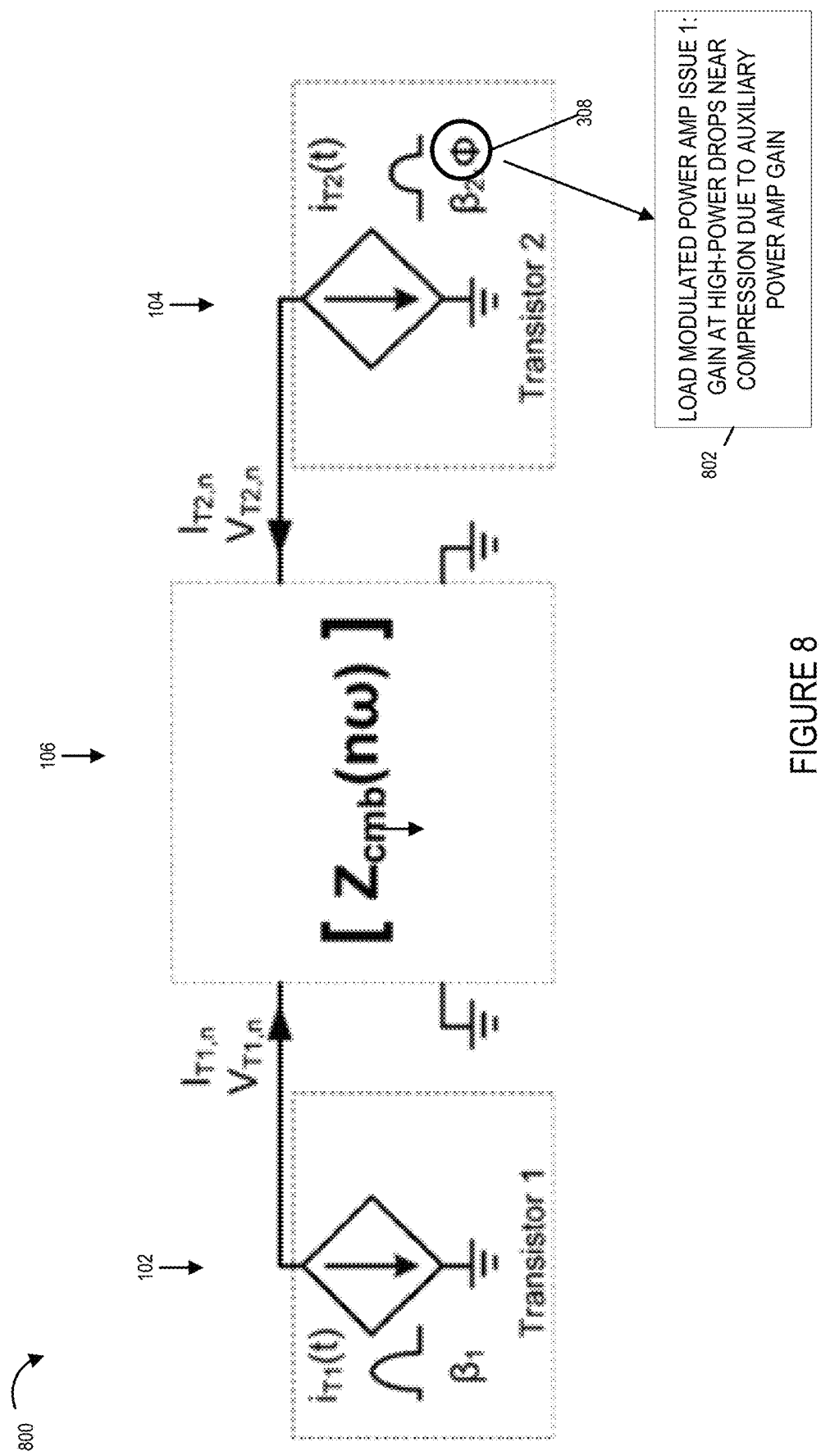
FIG. 8 is a drawing including the general dual input power amplifier of FIG. 1 and describes a first load modulated power amp issue that needs to be taken into consideration: the gain at high power drops near compression due to auxiliary power amp gain.
Figure 9:
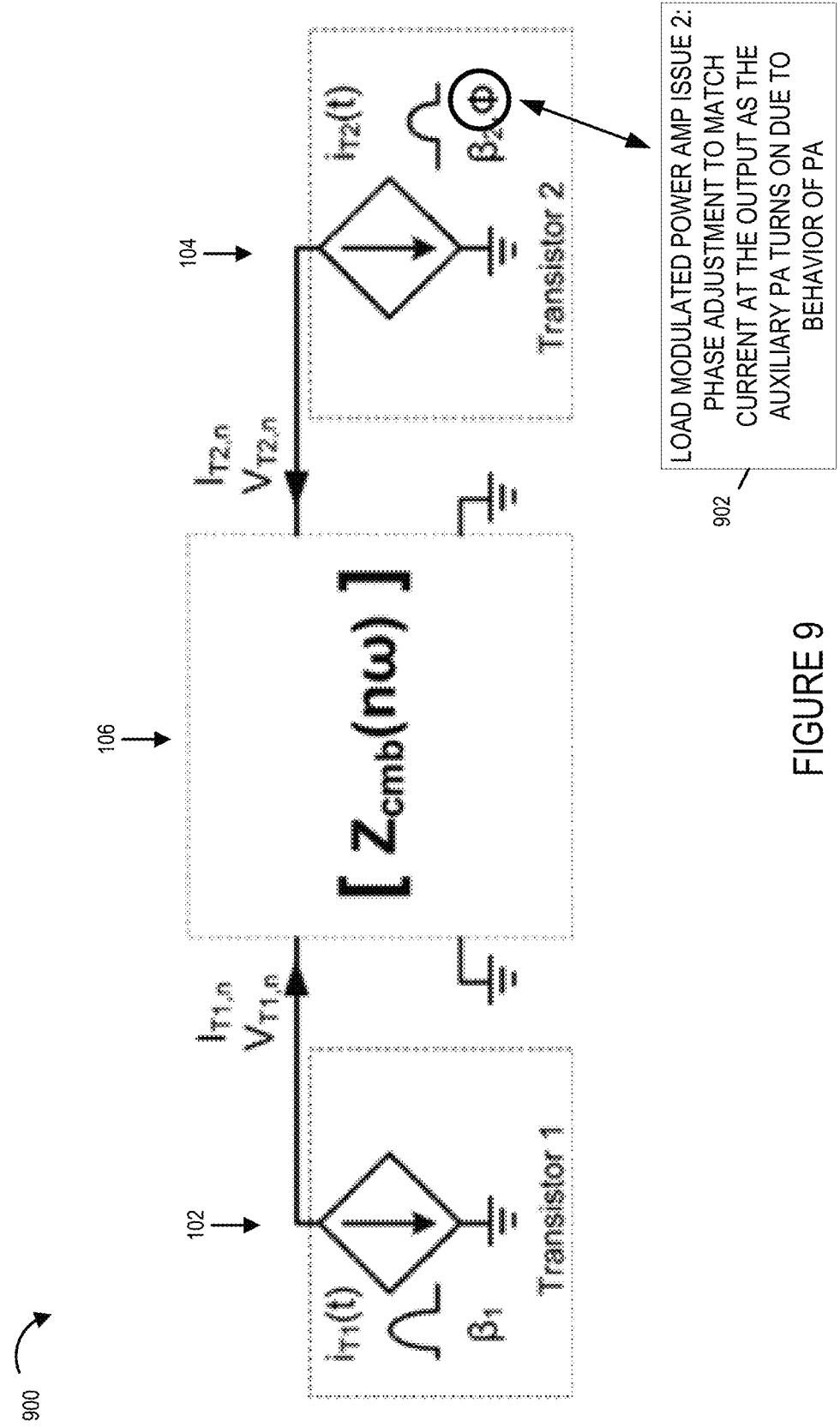
FIG. 9 is a drawing including the general dual input power amplifier of FIG. 1 and describes a second load modulated power amp issue that needs to be taken into consideration: phase adjustment is needed to match current at the output as the auxiliary PA turns on due to behavior of the PA.
Figure 10:
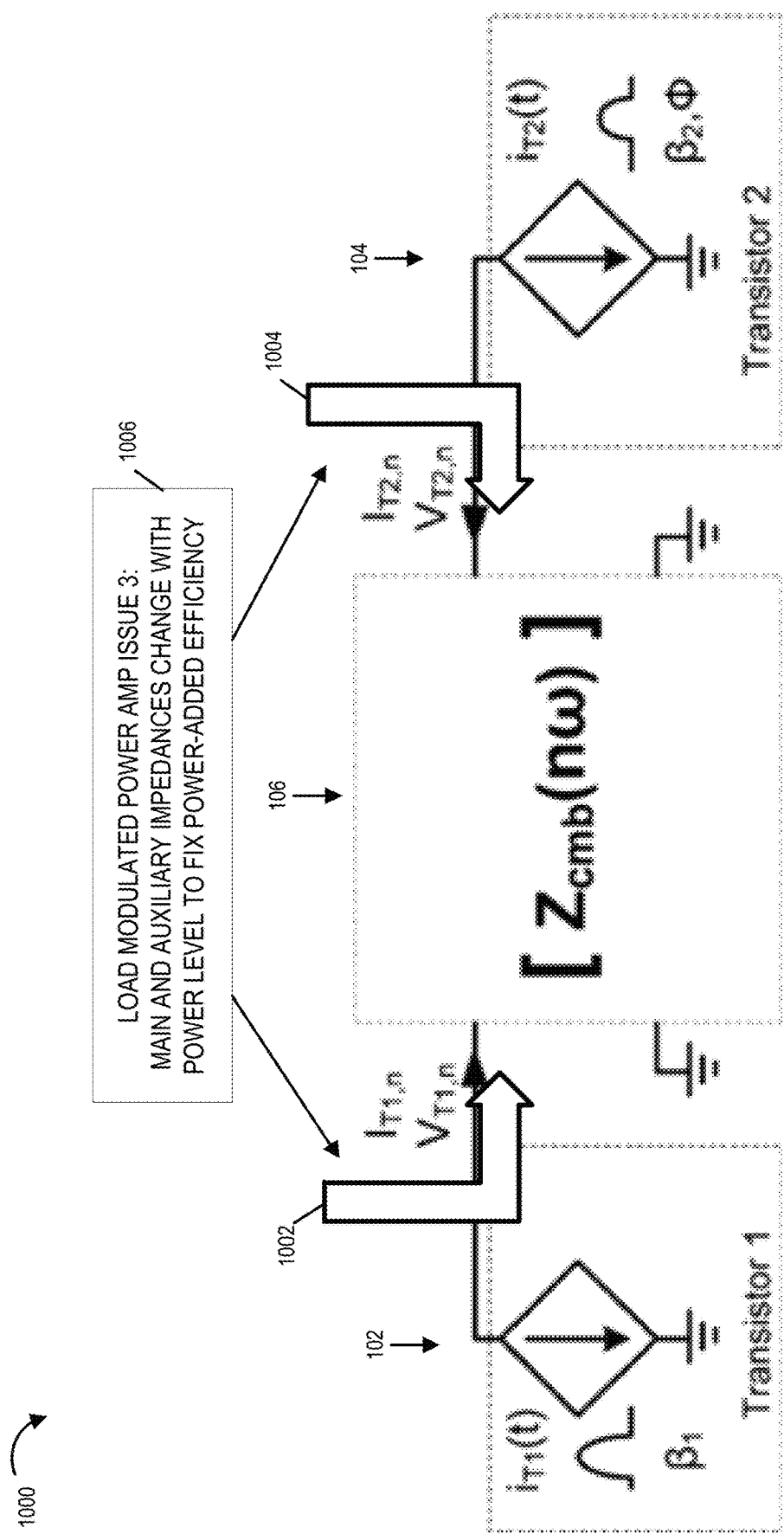
FIG. 10 is a drawing including the general dual input power amplifier 100 of FIG. 1 and describes a third load modulated power amp issue that needs to be taken into consideration: main and auxiliary impedances, represented change with power level to fix power-added efficiency.
Figure 11:
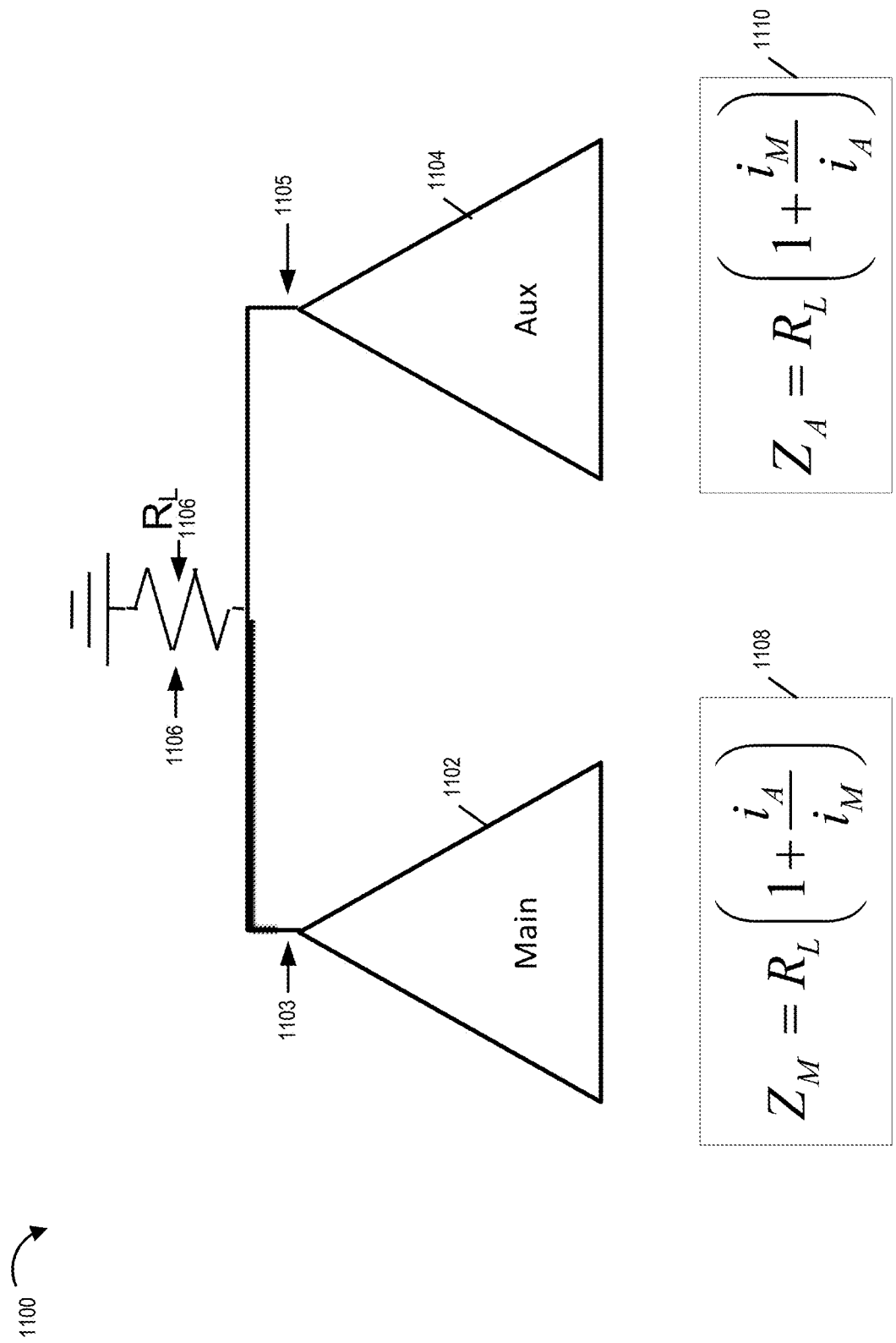
FIG. 11 is a drawing illustrating a main amplifier and an auxiliary amplifier, each operating as a current source, with their outputs coupled directly to load RL.

FIG. 11 is a drawing 1100 illustrating a main amplifier 1102 and an auxiliary amplifier 1104, each operating as a current source, with their outputs (1103, 1105) coupled directly to load RL 1106. The output impedance of the amplifiers is modulated by the auxiliary current.

The output impedance (ZM) of the main amplifier 1102 is modulated by the current (iA) of the auxiliary amplifier 1104, as indicated by box 1108. The output impedance (ZA) of the auxiliary amplifier 1104 is modulated by the current (iM) of the main amplifier 1102, as indicated by box 1110.

One disadvantage of this approach is that the main amplifier 1102 now sees a large voltage swing. In accordance with a feature of various embodiments of the current invention, a "stacked" power amplifier is implemented, which can support the larger voltage at load. For example, the main power amplifier 1102 includes a plurality of NMOS FETS, e.g. 4 NMOS FETs, in a stacked configuration and the auxiliary power amplifier 1104 includes a plurality of NMOS FETs, e.g. 4 NMOS FETs, in a stacked configuration.

Figure 12:
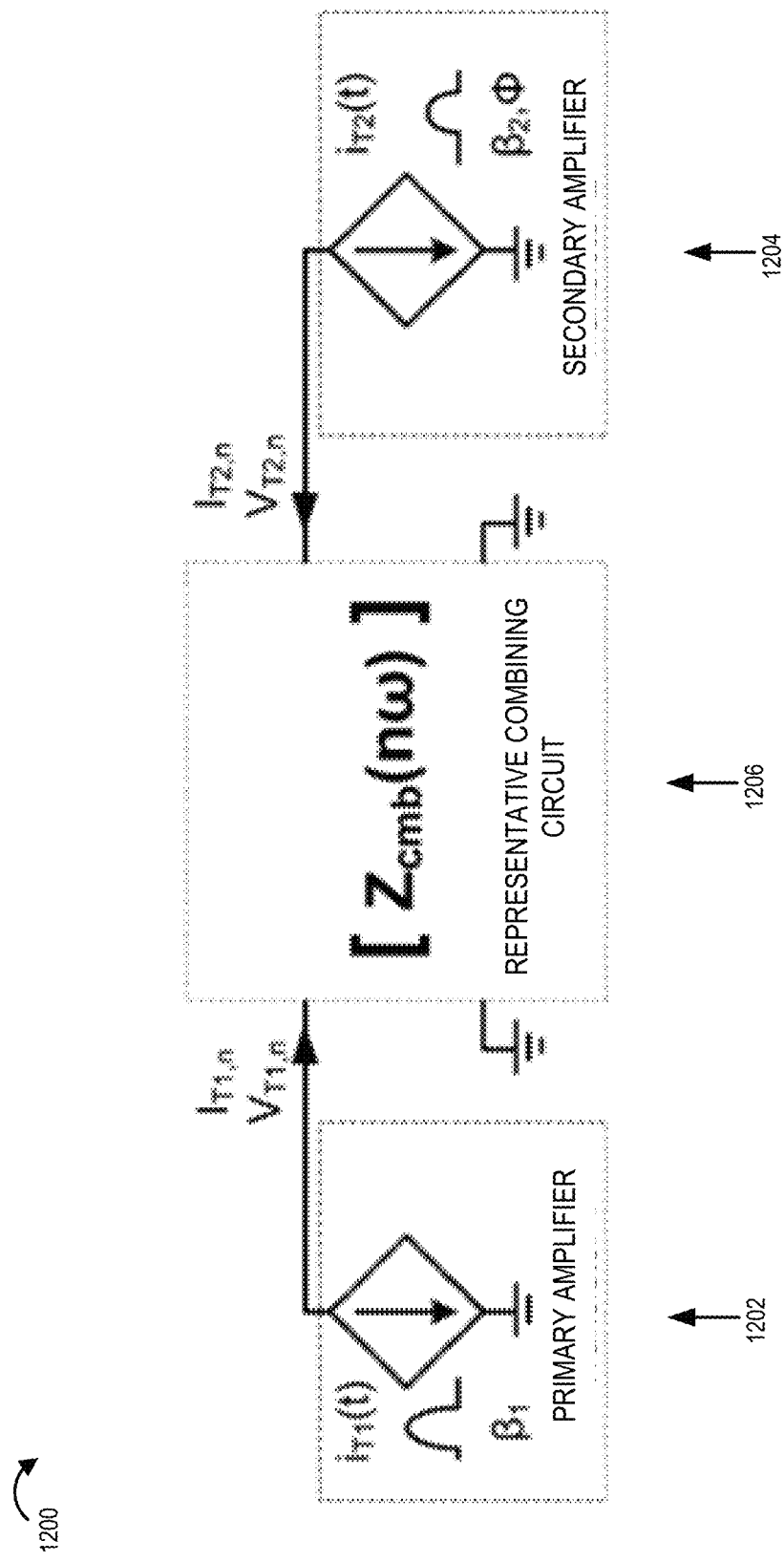
FIG. 12 is a drawing of an exemplary power amplification device in accordance with an exemplary embodiment, which includes a primary power amplifier (main power amplifier), which is a class AB or class B amplifier, a secondary power amplifier (auxiliary power amplifier), which is a class C amplifier, and a representative combining circuit including a series capacitor CM, coupled together.

Various aspects and/or features of power combining, in accordance with various embodiments of the present invention will some be described. FIG. 12 is a drawing of an exemplary power amplification device 1200 in accordance with an exemplary embodiment. Power amplification device 1200 includes a primary power amplifier (main power amplifier) 1202, which is a class AB or class B amplifier, a secondary power amplifier (auxiliary power amplifier) 1204, which is a class C amplifier, and a combiner 1206 coupled together as shown. The power combining approach of device 1200 is current combining, which deviates from the Doherty design approach of using a quarter wave transformer for combining.

Figure 13:
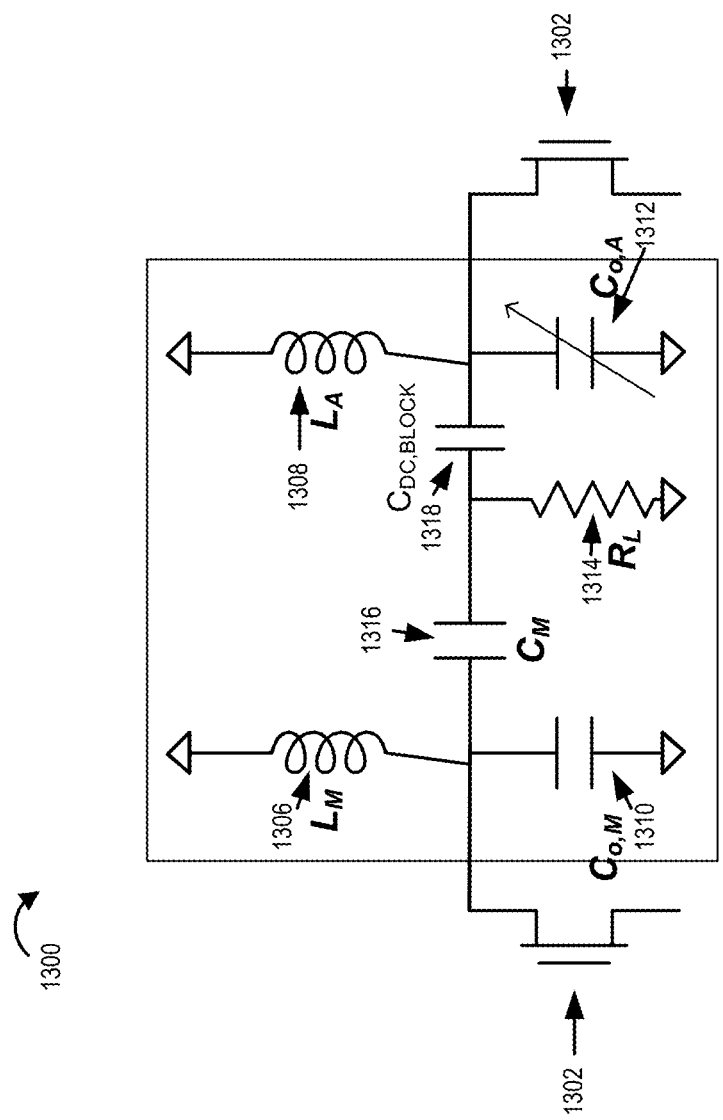
FIG. 13 is a drawing illustrating a exemplary embodiment for the representative combining circuit of FIG. 12 in accordance with an exemplary embodiment.

FIG. 13 is a drawing 1300 illustrating an representation of a model (shown for AC operation) for an exemplary combiner 1206, in accordance with an exemplary embodiment, coupled to a transistor 1302 of the primary (main) amplifier 1202, and a transistor 1304 of the secondary (auxiliary) amplifier 1204. The model for the combiner includes an inductor LM 1306, which is the inductor connected to the power supply for the primary (main) power amp 1202, an an inductor LA 1308, which is the inductor connected to the power supply for the secondary (auxiliary) power amp 1204, a capacitance $Co_{,,}M$ 1310, which is an output capacitance of the primary (main) power amplifier 1202, a capacitance $Co_{,,}A$ 1312, which is an output capacitance of the secondary (auxiliary) power amplifier 1204, a load RL 1314, a capacitor CM 1316, and a capacitor CDC, BLOCK 1318, coupled together as shown.

Series capacitor CM 1316 is chosen based on asymmetric PA bias (bias differences between primary PA 1202 and secondary power amp 1204) and auxiliary power amp capacitance variation ($Co_{,,}A$ 1312 capacitance variation, e.g., between low power mode and high power mode). $Co,A$ 1312 and $Co,M$ 1310 are "inherent" output device capacitances and change with output power in CMOS process. $Co,A$ 1312 changes with power due to class-C biasing.

Figure 14:
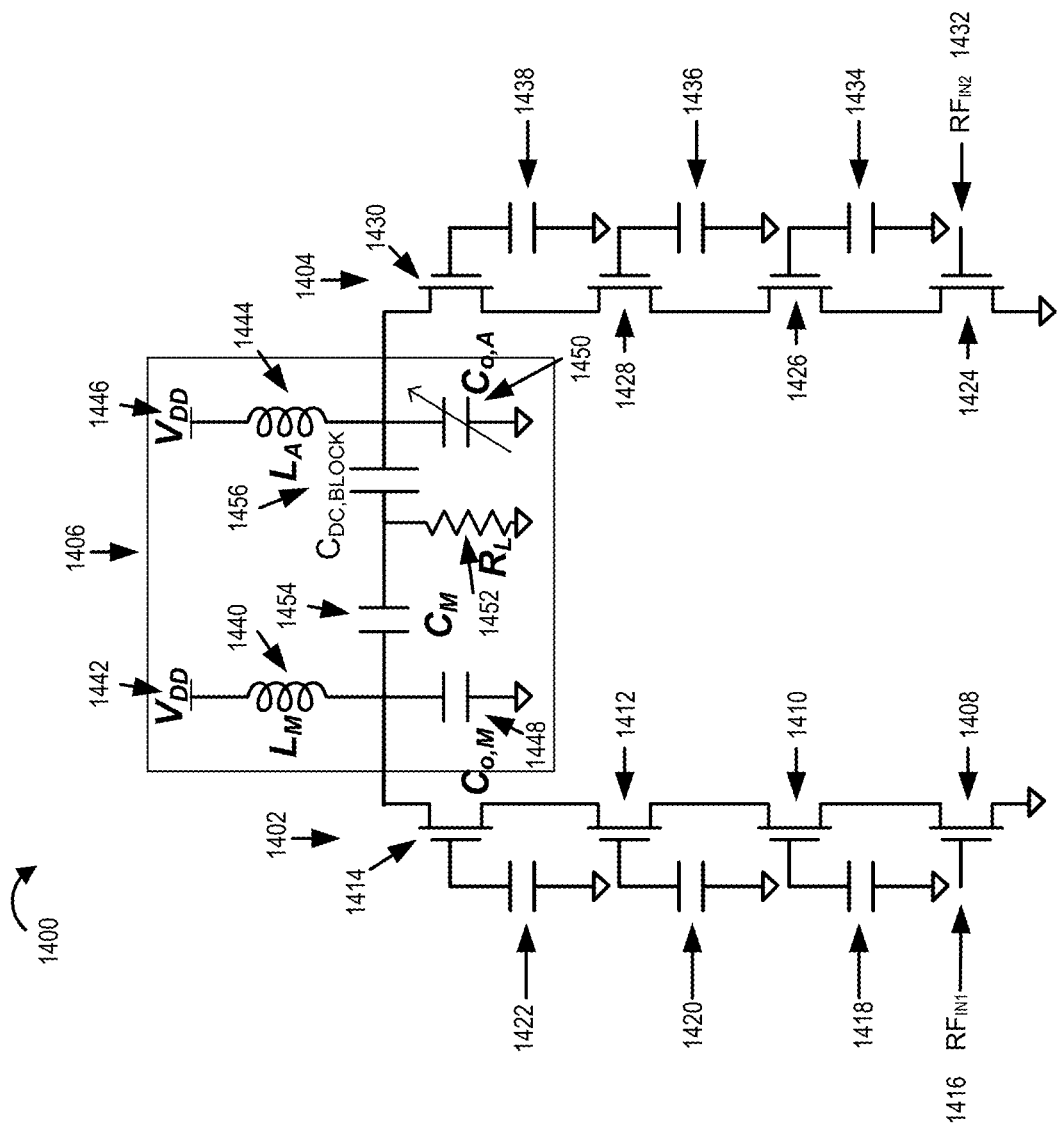
FIG. 14 is a drawing illustrating an exemplary power amplification device, in accordance with an exemplary embodiment, including a primary (main) power amplifier, a secondary power amplifier, and a combiner including capacitor CM, wherein the main power amplifier includes stacked MOS FETs to support larger voltages at the load.

FIG. 14 is a drawing illustrating an exemplary power amplification device 1400 including a primary (main) power amplifier 1402, a secondary power amplifier 1404, and a combiner 1406. The primary power amplifier 1402 includes 4 N MOS FETs (1408, 1410, 1412, 1414) coupled together in a stacked configuration, with the bottom FET 1408 receiving input signal RFIN1 1416 on its gate, and which each of the other FETs (1410, 1412, 1414) gate inputs being coupled to ground via a capacitor (1418, 1420, 1422), respectively. The secondary power amplifier 1404 includes 4 N MOS FETs (1424, 1426, 1428, 1430) coupled together in a stacked configuration, with the bottom FET 1424 receiving input signal RFIN2 1432 on its gate, and which each of the other FETs (1426, 1428, 1430) gate inputs being coupled to ground via a capacitor (1434, 1436, 1438), respectively.

Exemplary combiner 1406, is coupled to the drain of transistor 1414 of the primary (main) amplifier 1402, and to the drain of transistor 1430 of the secondary (auxiliary) amplifier 1404. The model for the combiner includes an inductor LM 1440, which is the inductor connected to the power supply VDD 1442 for the primary (main) power amp 1402, an inductor LA 1444, which is the inductor connected to the power supply VDD 1446 for the secondary (auxiliary) power amp 1404, a capacitance $Co_{,,}M$ 1448, which is an output capacitance of the primary (main) power amplifier 1402, a capacitance $Co_{,,}A$ 1450, which is an output capacitance of the secondary (auxiliary) power amplifier 1404, a load RL 1452, a capacitor CM 1454, and a capacitor CDC, BLOCK 1456, coupled together as shown.

Figure 15:
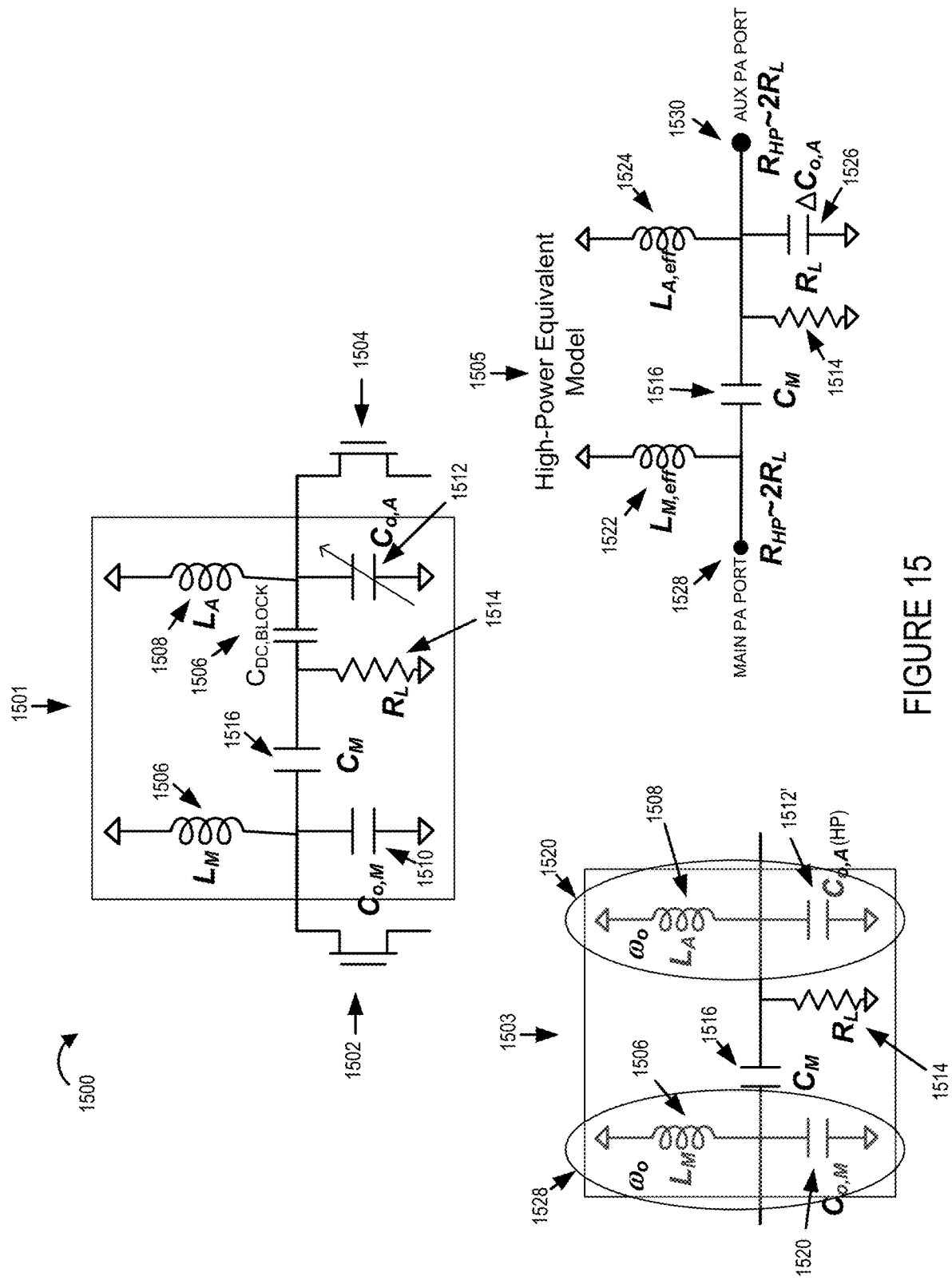
FIG. 15 illustrates a design method for high power operation (both main and aux power amps on) with regard to an exemplary dual input power amplifier device in accordance with an exemplary embodiment.

FIG. 15 is a drawing 1500 including a drawing illustrating a representation of a model (shown for AC operation as inductors are shown connected to gnd) for an exemplary combiner 1501, in accordance with an exemplary embodiment, coupled to a transistor 1502 (e.g., drain of N MOS FET) of the primary (main) amplifier, and a transistor 1504 (e.g., drain of N MOS FET) of the secondary (auxiliary) amplifier. The model for the combiner 1501 includes an inductor LM 1506, which is the inductor connected to the power supply for the primary (main) power amp, an inductor LA 1508, which is the inductor connected to the power supply for the secondary (auxiliary) power amp, a capacitance $Co_{,,}M$ 1510, which is an output capacitance of the primary (main) power amplifier, a capacitance $Co_{,,}A$ 1512, which is an output capacitance of the secondary (auxiliary) power amplifier, a load RL 1514, a capacitor CM 1516 (used for load modulation of the main power amp), and a DC blocking capacitor CDC, BLOCK 1518, coupled together as shown.

Series capacitor CM 1516 is chosen based on asymmetric PA bias (bias differences between primary PA and secondary power amp) and auxiliary power amp capacitance variation (Co,,A 1512 capacitance variation, e.g., between low power mode and high power mode). Co,A 1512 and Co,M 1510 are "inherent" output device capacitances and change with output power in CMOS process. Co,A 1512 changes with power due to class-C biasing.

Co,M 1510 is substantially the same for high power and low power operation. Co,A 1512 is significantly different for high power and low power operation, as indicated by the representation of Co,A as a variable capacitor with the arrow. This is shown in the NMOS Main and Auxiliary Amplifier simulation shown in FIGS. 17 and 18.

Drawing 1500 also includes drawing 1503, which is a high power representation of the exemplary combiner 1501. Co,A (HP) 1512' is the high power representation of Co,A 1512.

LM 1506 is defined to be nearly resonant with Co,M 1510, as indicated by oval 1518, where the remaining reactance from resonating out CoM 1510 is no more than 40% of the original LM and is referred to as LM,eff 1522.

LA 1508 is defined to be nearly resonant with Co,A (HP) 1512', as indicated by oval 1520, where, the remaining reactance from resonating out CoA(HP) 1512' is no more than 40% of the original LA.

Drawing 1500 also includes drawing 1505, which is a High-Power Equivalent model. LM,eff 1522 is a small amount of residual inductance, which remains after most of the inductance of LM 1506 is absorbed by the resonance with Co,M 1510. LM, eff 1522 is typically less than 40% of LM 1506. In some embodiments, LM, eff 1522 is less than 10% of LM 1506.

The combination of LA 1508 and Co,A(LP) 1512" (low power output capacitance of auxiliary amp—see FIG. 16) produces an effective inductance LA,eff 1524. The auxiliary capacitor Co,A 1512 is changing with power. Co,A (HP) 1512' is more than 200% higher than Co,A(LP) 1512", and ΔCo,A 1526 is used to indicate the portion of CoA (HP) 1512' corresponding to the change in power, e.g., from low power mode (aux amp off) to high power (aux amp On).

Figure 16:
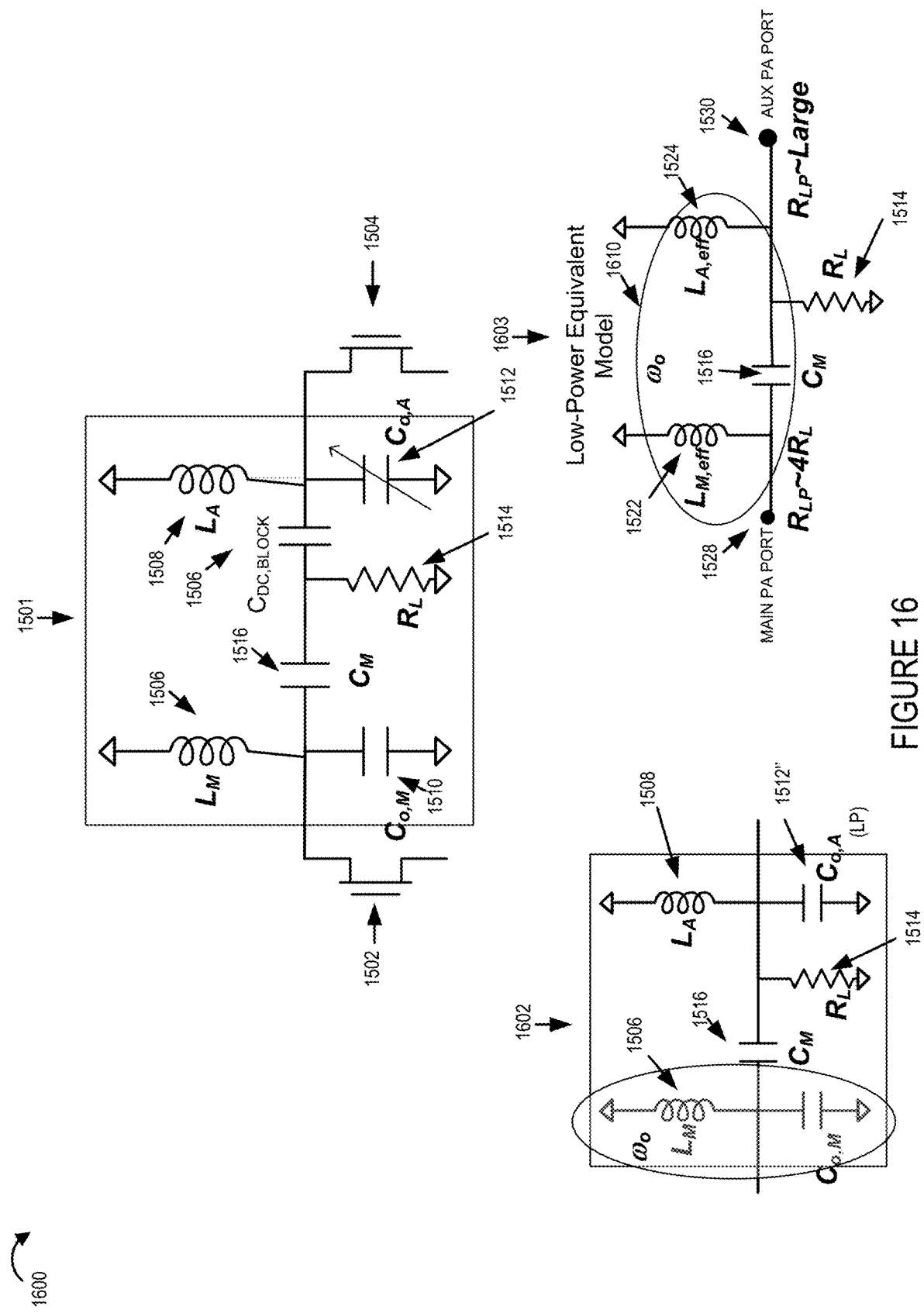
FIG. 16 illustrates a design method for low power operation (main power amp on and aux power amp off) with regard to an exemplary dual input power amplifier device in accordance with an exemplary embodiment.

The CoA 1512 at high power, represented by Co,A (HP) 1512' (FIG. 15) is typically more than 200% higher than it was at low power represented by Co,A(LP) 1512" (see FIG. 16).

At ω0 inductances from load inductors (LM 1506 and LA 1508) on the main and auxiliary PAs resonate with output capacitance Co,M 1510 and CO,A(HP) 1512' leaving similar loadline matching at both the main and auxiliary ports (1528, 1530) to the load RL 1514. RHP is approximately 2RL. RHP is the "loadline" resistance that both the main and auxiliary amplifiers want to see at high power. A 50 ohm load (RL) would be matched with a 100 ohm resistance from the main PA and a 100 ohm resistance from the auxiliary PA.

CM 1516 adds some series impedance that is absorbed into the power matching while operating in the high power mode.

FIG. 16 is a drawing 1600 including a drawing illustrating a representation of a model (shown for AC operation as inductors are shown connected to gnd) for an exemplary combiner 1501, in accordance with an exemplary embodiment, coupled to a transistor 1502 (e.g., drain of N MOS FET) of the primary (main) amplifier, and a transistor 1504 (e.g., drain of N MOS FET) of the secondary (auxiliary) amplifier. Co,M is substantially the same for high power and low power operation. Co,A is significantly different for high power and low power operation, as indicated by the representation of Co,A as a variable capacitor with the arrow. Combiner representation 1501 has been previously described with respect to FIG. 15.

Low power mode will now be described. Auxiliary PA is off. Output capacitance CoA drops when compared to high power operation, thus CoA(LP) 1512"<CoA(HP) 1512'. (Co,A (HP) 1512' is typically more than 200% higher than Co,A(LP) 1512"). The combination of LA 1508 and Co,A (LP) 1512" produces an effective inductance LA,eff 1524 that produces an impedance transformation network to reduce the load impedance at the main PA. CM 1516 and Leff, M 1522 and Leff, A 1524 resonate at ω to change the impedance seen at the main amplifier.

Drawing 1600 also includes drawing 1602, which is a low power representation of the exemplary combiner 1501. Co,A (LP) 1512" is the low power representation of Co,A 1512. LM 1506 is defined to be nearly resonant with Co,M 1510, as indicated by oval 1604, where the remaining reactance from resonating out CoM 1510 is no more than 40% of the original LM and is referred to as LM,eff 1522.

Drawing 1600 also includes drawing 1603, which is a Low-Power Equivalent model. LM,eff 1522 is a small amount of residual inductance, which remains after most of the inductance of LM 1506 is absorbed by the resonance with Co,M 1510. LM, eff 1522 is typically less than 40% of LM 1506. In some embodiments, LM, eff 1522 is less than 10% of LM 1506. LA,eff 1524 is an effective inductance which is the combination of LA 1508 and Co,A(LP) 1512".

$C_M$ 1516 and Leff, M 1522 and Leff, A 1524 resonate at ω0, as indicated by oval 1610, to change the impedance seen at the main amplifier.

RLP is approximately 4RL. The RLP is the "loadline" resistance that the main amplifier want to see at low power at the main port 1528. A 50 ohm load (RL) would be matched with a 200 ohm resistance from the main PA. At the auxiliary port 1530, RLP is large, e.g., more than at least eight times RL.

Figure 17:
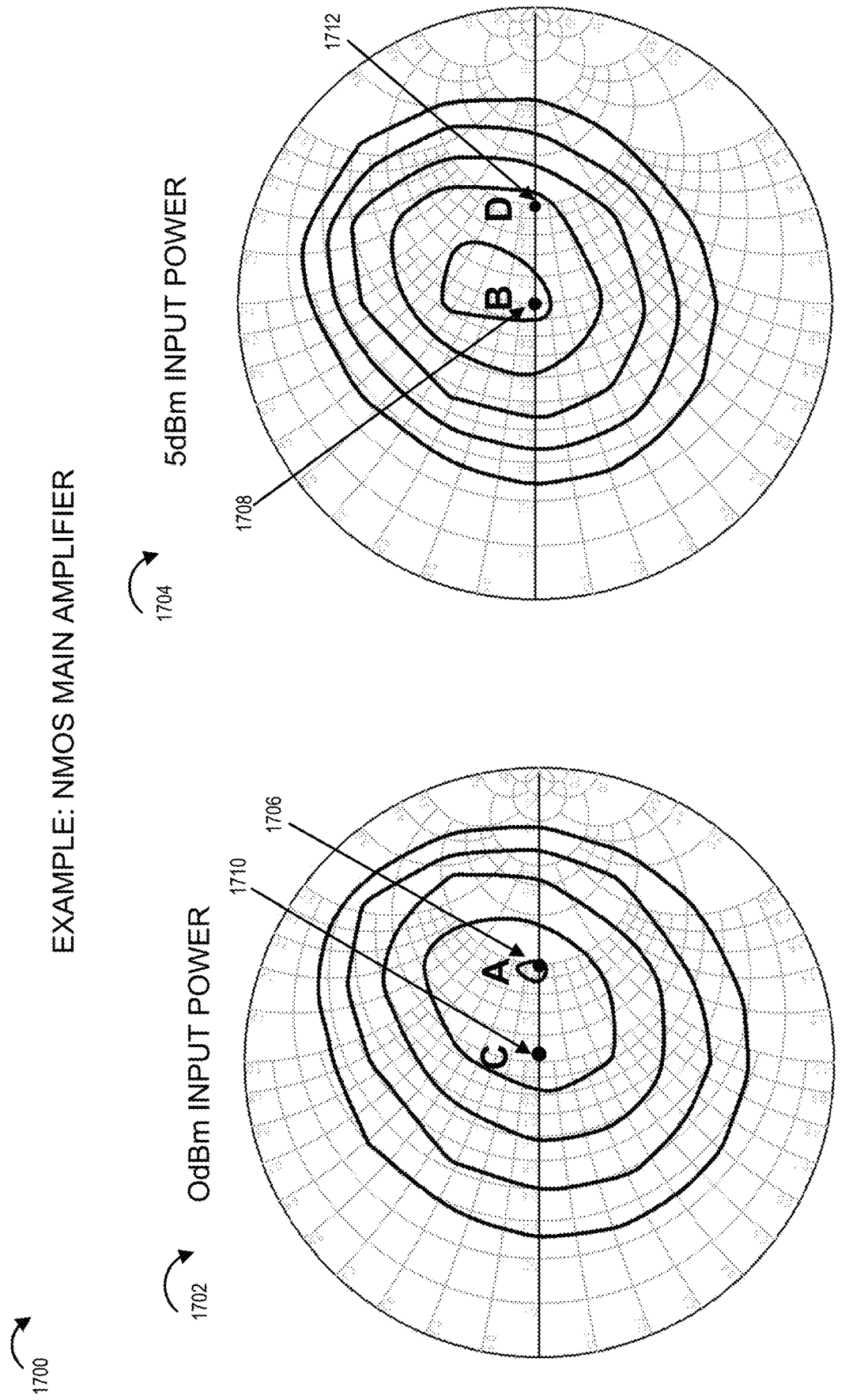
FIG. 17 illustrates an example for a MNOS Main Amplifier an includes a first Powered Added Efficiency (PAE) contour graphs for 0 dBm input power and a second PAE contour graph for 5 dBm input power.

FIG. 17 is a drawing 1700 illustrating an example for a NMOS Main Amplifier. Drawing 1700 includes a first Powered Added Efficiency (PAE) contour graph 1702 for 0 dBm input power and a second PAE contour graph 1704 for 5 dBm input power.

Under normal circumstances, the impedance of the main PA changes from A (1706)→B (1708), which is a change from 100 ohms to 50 ohms, with increasing power level. This is not useful for load modulation.

For load modulation, it is desirable for the impedance to change from C (1710)→D (1712) with increasing power level.

A Doherty approach would use a transmission line to implement C→D. But if considering the loss from a quarter transmission line (TL) of 0.7-1 dB in Doherty, no improvement would be found by using the Doherty approach.

In accordance with an approach using an embodiment of the present invention, one would match device at high power to 100 ohms and design the combining cap $C_M$ such that the impedance is transformed to 50 ohms at low power.

Figure 18:
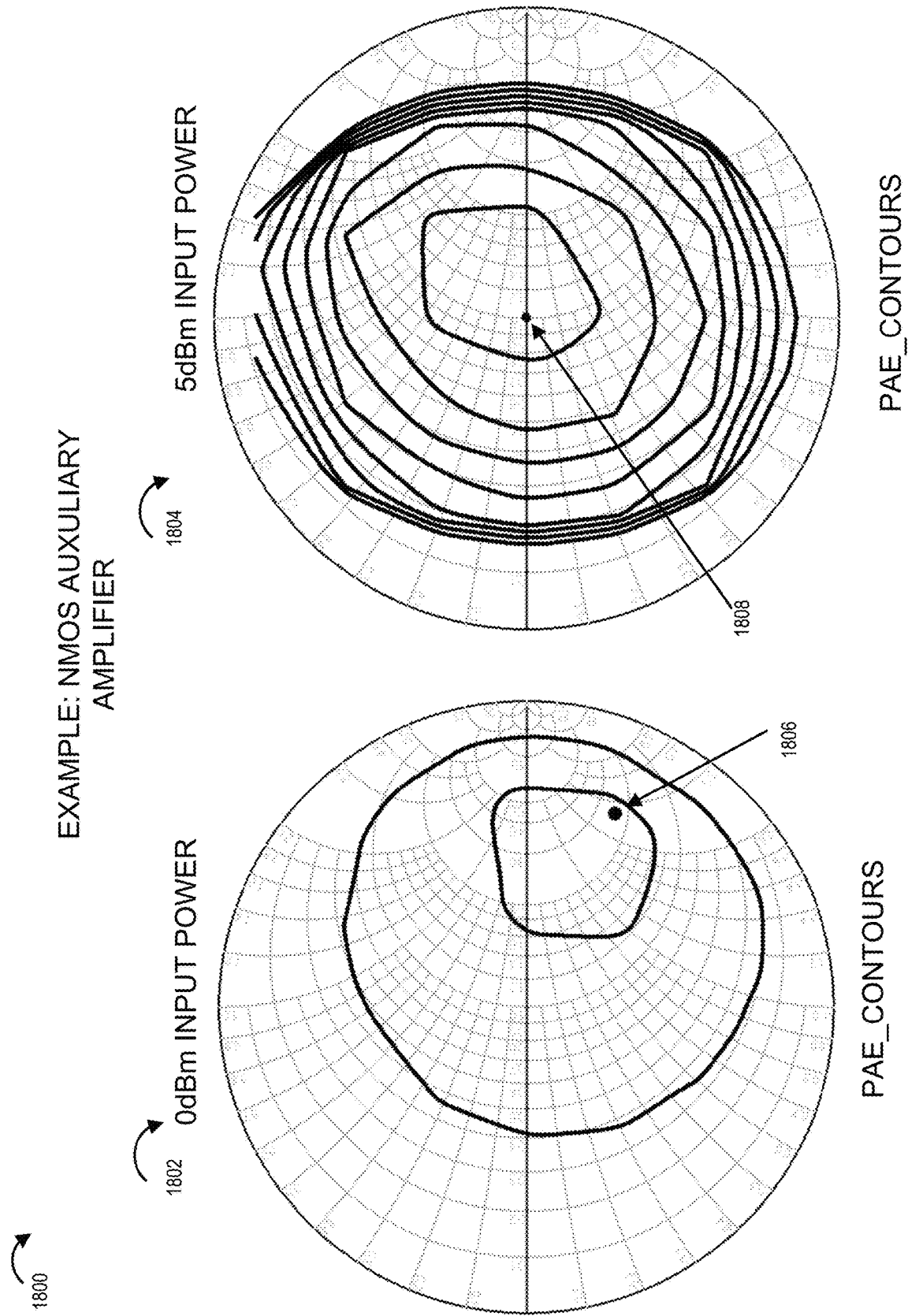
FIG. 18 is a drawing illustrating an example for a MNOS Auxiliary Amplifier and includes a first Powered Added Efficiency (PAE) contour graph for 0 dBm input power and a second PAE contour graph for 5 dBm input power.

FIG. 18 is a drawing 1800 illustrating an example for a NMOS Auxiliary Amplifier. Drawing 1800 includes a first Powered Added Efficiency (PAE) contour graph 1802 for 0 dBm input power and a second PAE contour graph 1804 for 5 dBm input power.

The auxiliary power amplifier is biased in class-C and indicates a high loadline impedance and capacitance for low input power, as indicated by the location of dot 1806 on the first PA PAE contour graph 1804.

Figure 19:
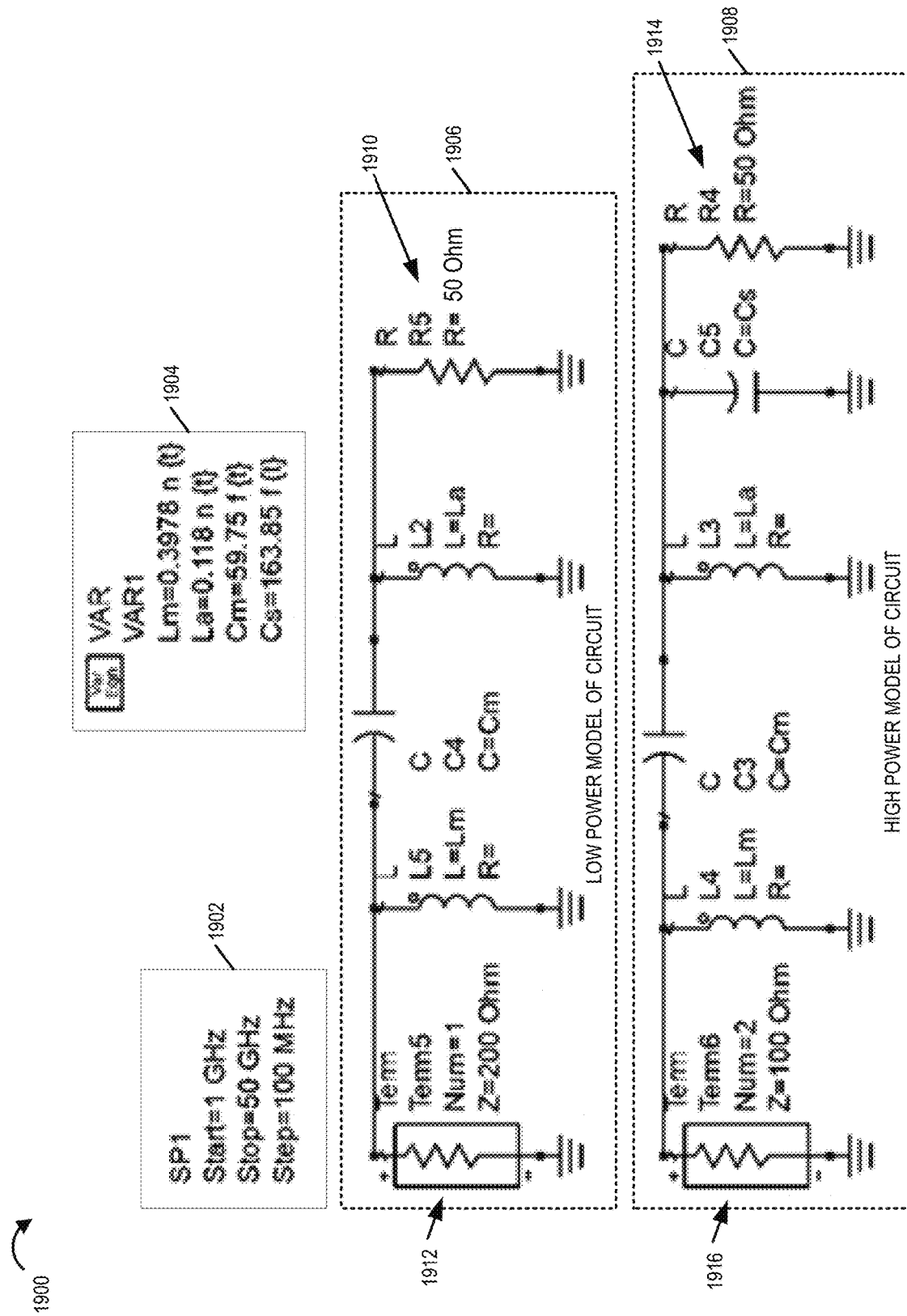
FIG. 19 is a drawing which illustrates exemplary simulation inputs for exemplary operation of a dual input power amplifier device, which works successfully at 30 GHz, implemented in accordance with an exemplary embodiment.

FIG. 19 is a drawing 1900 which illustrates exemplary simulation inputs for exemplary operation of a dual input power amplifier device implemented which works at 30 GHz in accordance with an exemplary embodiment. Set of information 1902 identifies the start, stop and step frequencies (1 GHz, 50 GHz, and 100 MHz) of the simulation. Set of information 1904 identifies values of Lm,eff, La,eff, Cm, and Cs used, which work at 30 GHz. Circuit 1906 is a low power model of the circuit with values of Lm,eff, La,eff and Cm that map to an implementation that works at 30 GHz. Circuit 1908 is a high power model of the circuit with values of Lm,eff, La, eff, Cm, and Cs (additional capacitance added by auxiliary amp as it turns on) that map to an implementation that works at 30 GHz. It may be observed that the load resistance (1910) for the low power model (1906) is 50 ohms, and that the load line resistance Z (1912) is 200 ohms. (RP=4RL) It may be observed that the load resistance (1914) for the high power model (1914) is 50 ohms, and that the load line resistance Z (1916) is 100 ohms. (RP=2RL).

Figure 20:
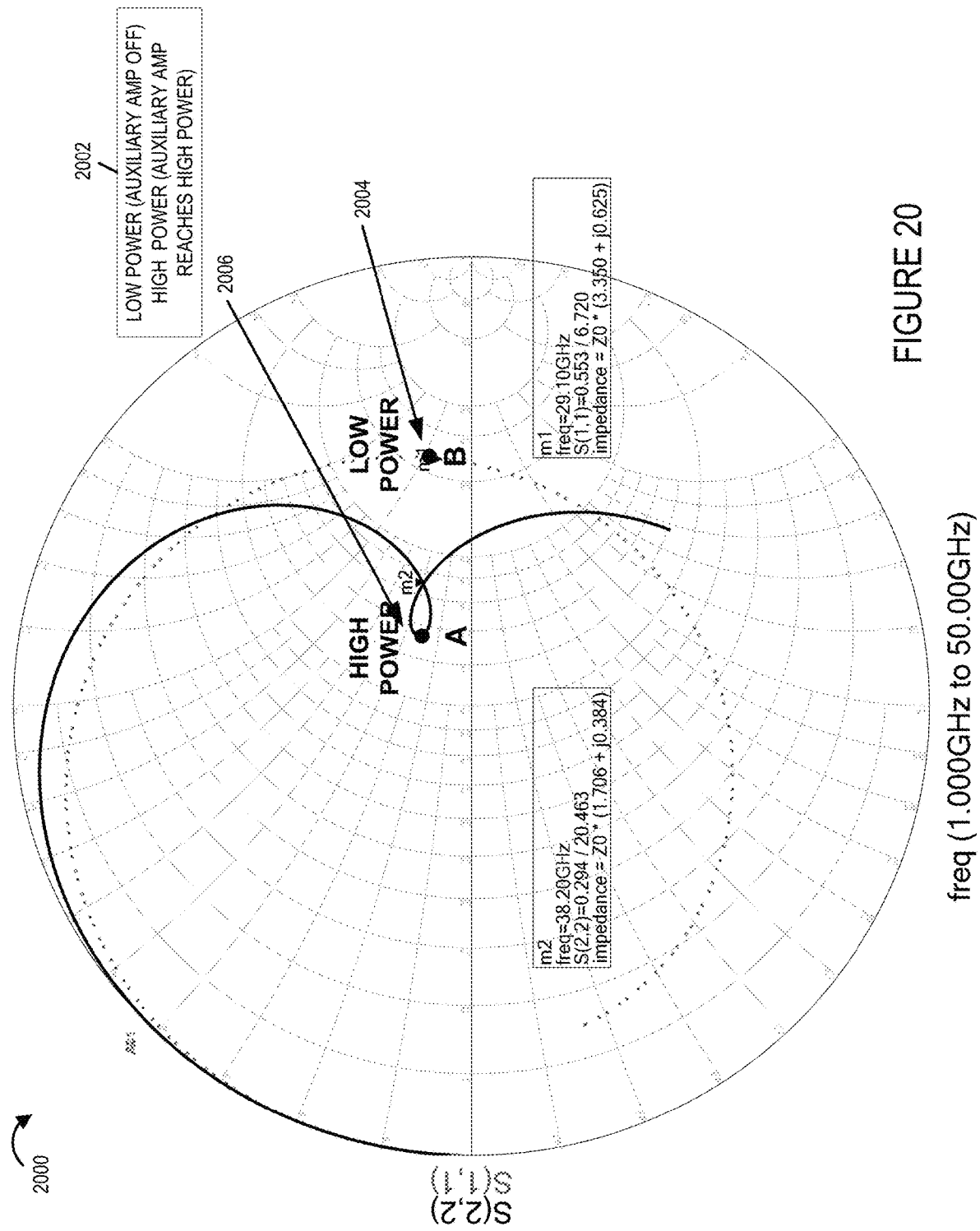
FIG. 20 is a PAE contour graph which illustrates simulation results for exemplary operation of a dual input power amplifier device (corresponding to the exemplary input of FIG. 19) implemented in accordance with an exemplary embodiment.

FIG. 20 is a PAE contour graph 2000 which illustrates simulation results for exemplary operation of a dual input power amplifier device (corresponding to the exemplary input of FIG. 19) implemented in accordance with an exemplary embodiment. Block 2002 indicates that in low power, the auxiliary amp is off, and in high power the auxiliary amp reaches high power. Dot A 2006 on graph 2006 indicates high power. Dot B 2004 in graph 2005 indicates low power.

Various aspects and/or features of the design method will now be discussed. The CM series capacitor, used in various embodiments in accordance with the present invention, addresses a design technique to implement a power combiner with only a capacitor that introduces far less loss and area requirements than a transmission line. Capacitors in CMOS processes have significantly higher Q than transmission lines reducing losses. This characteristic gives the approach, in accordance with the present invention, of using the CM series capacitor for combining, a significant advantage over Doherty approaches for load modulation.

Solutions for other design issue problems will now be discussed. A first issue of concern is gain compression. An auxiliary amplifier (biased in class-C) exhibits a gain variation that does not compensate for the main amplifier gain compression. A solution to this problem, in accordance with a feature of some embodiments of the present invention includes designing, implementing and using a neutralization network in the class-C amplifier (not connected to the output). The neutralization network is designed to increase the gain at high power levels relative to low power levels.

A second issue of concern is phase variation. In accordance with a feature of some embodiment of the present invention, the power amplifier is implemented as a "dual input" power amplifier such that one can use phase shifters to dynamically change the phase into the two paths of the power amplifier.

A real CMOS PA has several issues. It should be able to handle high voltage swings. In accordance with a feature of some embodiments of the present invention, stacked FET PAs are used in the implementation. It is desirable to eliminate feedback through the PA. In accordance with a feature of some embodiments of the present invention, utilization network(s) are used. It is desirable to improve backoff efficiency. In accordance with a feature of some embodiments of the present invention, the implementation allows supply modulation.

The stacked FET increases the loadline impedance to be a current source. The main amplifier is assumed to be biased in class AB or class B, while the auxiliary amplifier is biased in class C. In put power is split between the PAs (main and aux), while the auxiliary amplifier is twice the size of the main amplifier.

A triangle is used to illustrate the power amplifiers in FIGS. 21 to 26 but due to size constraints the stack of transistors and capacitors which form the amplifier are not necessarily all shown inside the triangle representation the individual power amplifier. Accordingly, simply because a component is not inside a triangle does not mean it is not part of the primary or secondary power amplifier in the corresponding figure and elements which are described as being part of a particular amplifier should be considered a component of the amplifier whether it is shown internal or external to a triangle representing a particular amplifier to which the component corresponds.

Figure 21:
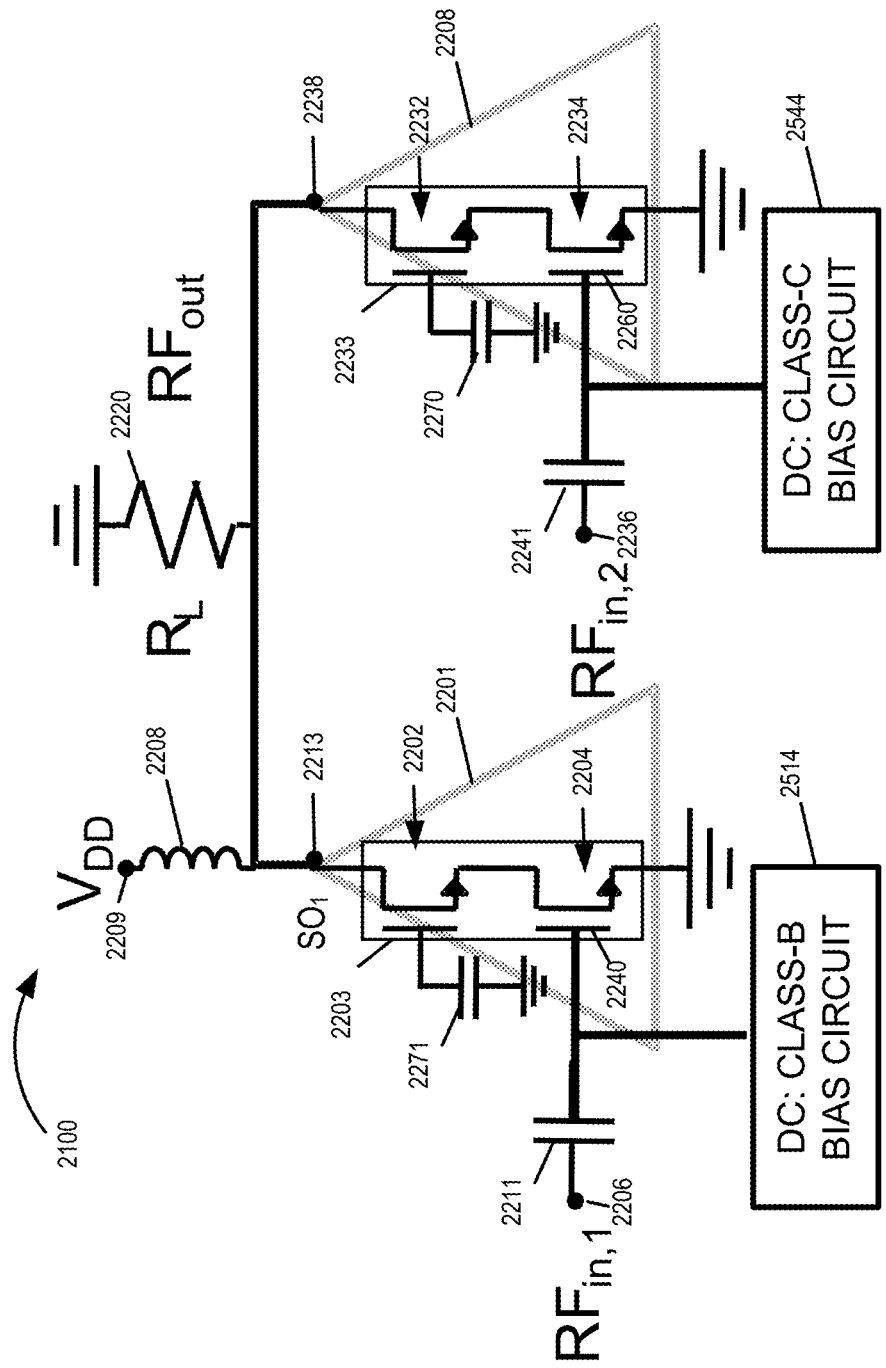
FIG. 21 shows a first exemplary amplifier implemented in accordance with one embodiment of the invention.

FIG. 21 shows a first exemplary amplifier device 2100 implemented in accordance with one embodiment of the invention that uses a primary power amplifier 2201 in combination with a secondary power amplifier 2208. The primary and secondary power amplifiers are arranged in parallel with the output of both amplifiers 2201 and 2208 being on during high power mode of device operation. During the low power mode of operation the secondary amplifier 2208 is off but the primary power amplifier 2201 is on. Regardless of the mode of operation DC power, e.g., the gate bias voltages, are supplied to both amplifiers during both the low and high power modes of operation.

As explained above the capacitance of the secondary power amplifier 2208 changes significantly, e.g., more than doubles, when the secondary power amplifier 2208 transitions from the off/low power mode of amplifier operation to the high power mode of operation. The impendence and capacitance of the primary amplifier 2201 remains relatively constant in both the low and high power modes of operation since the primary amplifier 2201 remains on in both the low and high power modes of operation.

The power amplifiers of FIGS. 22-26 support low and high power modes of operation where which are the same or similar to that described with regard to the FIG. 21 embodiment. Thus during high power mode of operation the secondary amplifiers shown in FIGS. 22-26 will be on but off during low power mode of operation. Similar changes in the capacitance of the secondary power amplifiers occurs in the devices shown in FIGS. 22-26 with the capacitance of the secondary amplifier at least doubling and often more than doubling when the secondary amplifier changes from the off/low power mode of device operation to the high power mode of device operation in which the secondary amplifier is on and contributes current to the output load.

The amplifier devices shown in FIGS. 21 to 26 are well suited for RF transmission applications, e.g., to support RF radio signal transmissions via a transmitter array. In some such embodiments the load RL corresponds to an antenna element or set of antenna elements of the antenna array being used to support radio transmissions. The amplifier device shown in FIGS. 21-26 can and in some embodiments is used to support device embodiments where beam steering is implemented.

In the FIG. 21 embodiment, the amplifier 2100 operates as a current-combined, dual input PA with the primary, e.g., main amplifier 2201 operating as a class-AB or class-B amplifier and the secondary (auxiliary) power amplifier 2208 operating as a Class-C power amplifier. The bias voltage source 2514 is shown as a Class B source but would be a Class-AB bias voltage source in the case where the primary amplifier is operated as a Class-AB amplifier.

Separate RF signal inputs 2206, 2236 for the primary 2201 and secondary 2208 power amplifier are provided in the FIG. 21 embodiment. In particular the primary amplifier includes a first RF signal input RFin,1 2206 while the secondary power amplifier 2208 includes a second RF signal input RFin,2 2236.

In various embodiments the RF signals supplied to the primary and secondary amplifiers are different in at least one of phase and/or amplitude. In some embodiments the signal supplied to the secondary power amplifier 2208 is derived from the signal supplied to the first RF signal amplifier 2201. As will be discussed below in some embodiments a network using inductors and capacitors is used to generate the signal supplied to the second amplifier 2208 by applying an intentional phase shift into the signal supplied to the first RF signal amplifier 2201 to generate the signal supplied to the secondary amplifier 2208. Such an approach avoids the use of transmission lines as part of the power amplifier device. In other embodiments a circuit including a transmission line is used to generate the signal supplied to the second amplifier 2208 by introducing an intentional phase shift into the signal supplied to the first signal amplifier 2201 to thereby generate the second amplifier signal input. By introducing a phase shift between signals RFin,1 and RFin,2 it is possible to prevent the output signals for the primary and secondary amplifiers being out of phase. Such a phase difference might occur between the amplifier output signals if one or more of the amplifier introduced a phase shift that was not taken into consideration and compensated for at the signal input to the auxiliary amplifier.

The power amplification device 2100 includes a primary power amplifier 2201 including one or more field effect transistors (FETs) 2202, 2204 arranged in a first stack 2233. The gate 2240 of a first FET 2204 is coupled to a CLASS-B or CLASS AB DC bias voltage source 2514 with a DC blocking capacitor 2211 being used to couple the gate 2240 to the first RF signal input 2206. The gate of the second FET 2204 is coupled to grand by a capacitor 2271. The output of the primary amplifier SO1 2213 is coupled to a first voltage source VDD 2209 by a first inductor 2208 and is also coupled to the output load RL 2220.

The secondary power amplifier 2208 includes a second stack 2233 of FETs 2232, 2234 with the gate 2260 of the first FET 2234 in the second stack 2233 being coupled to the second F input 2236 via a second DC blocking capacitor 2241. The gate of the second capacitor 2232 in the second stack 2233 is coupled to ground by capacitor 2270. The drain 2238 of the secondary power amplifier 2208 serves as the output 2238 of the second power amplifier 2208 and is coupled to the load 2220.

Thus from FIG. 21 it can be seen that the device 2100 includes two amplifiers 2201, 2208 which are arranged in parallel but which receive different RF signal inputs and are biased differently, e.g., with the first amplifier being biased to operate as a Class-AB or Class-B amplifier and the secondary amplifier 2208 being biased to operate as a Class-C amplifier.

Figure 22:
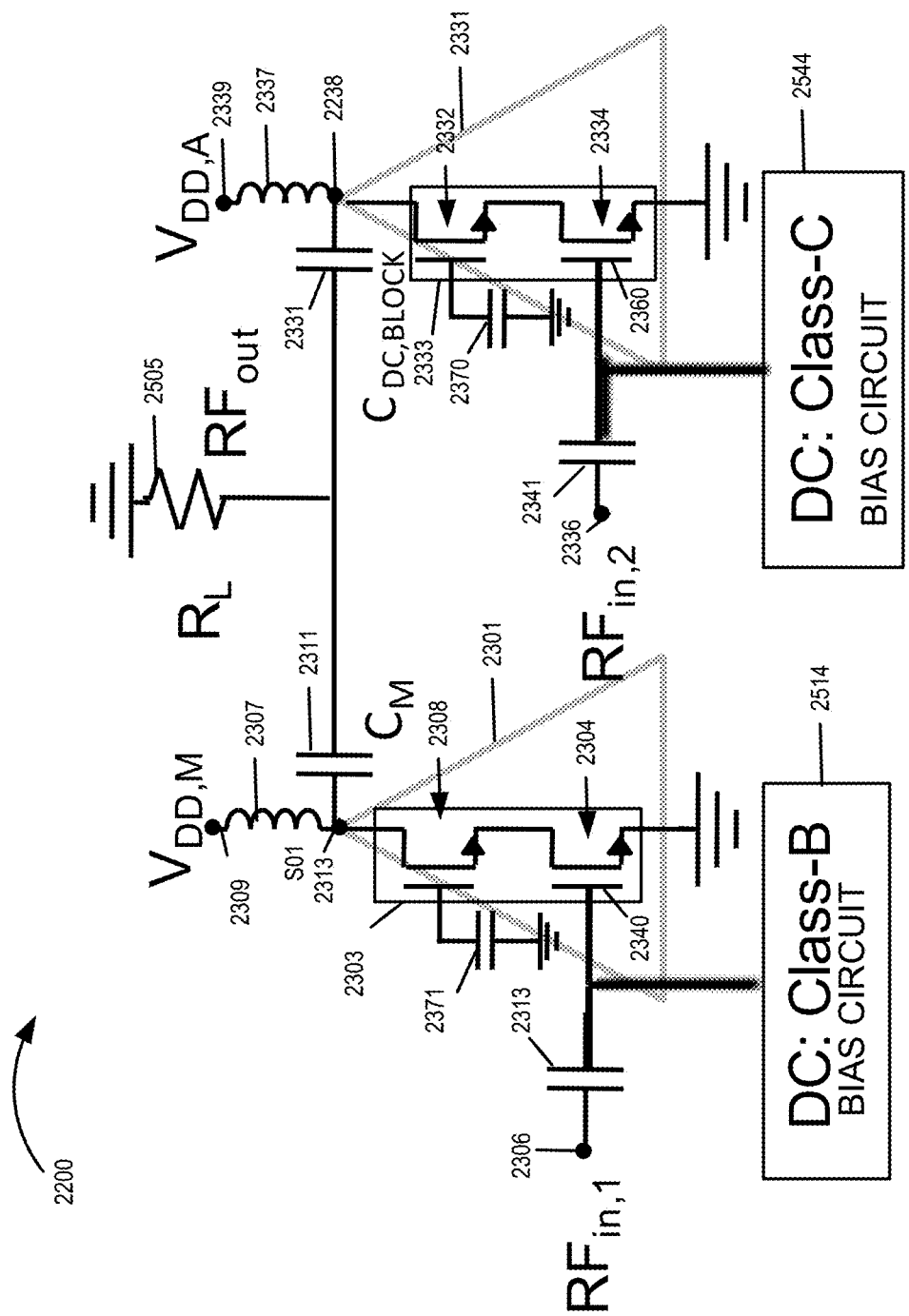
FIG. 22 shows a second exemplary amplifier implemented in accordance with the invention.

FIG. 22 shows an amplifier device 2300 which is similar to the amplifier 2100 but with a capacitor CM 2311 being used to couple the output of the primary amplifier 2301 to the output of the secondary amplifier 2238 and load RL 2505. The components of the amplifier device 2200 are coupled together as shown in FIG. 22. Series capacitor CM is chosen in some embodiments based on the asymmetric power amplification bias voltages used and the secondary power amplifier capacitance variation between the on high capacitance during the "on" high power mode of operation and lower capacitance of the secondary amplifier 2331 during the low power "off" mode of operation. CM 2311 adds some series impedance that is absorbed into the power matching. CM series capacitance allows the power combining to be implemented with a capacitor and without the need for a transmission line. This approach introduces far less loss and area requirements than a transmission line. Furthermore in CMOS implementations, e.g., implementations using N-MOSFETs, this is particularly useful since capacitors in CMOS processes have significantly higher Q than transmission lines reducing losses as compared to embodiments where transmission lines are used on the output for power combining.

FIGS. 23 through 26 show various exemplary amplifier implementations. The same reference numbers are used in these figures to refer to the same or similar elements. Accordingly, once an element is described it may not be described again in detail in the later embodiment in which the same reference number is used.

In various ones of the FIG. 23-26 embodiments stacked FET power amplifiers are used to support high voltage swings. In at least some embodiments. Feedback through the power amplifiers is reduced or eliminated through the use of a neutralization network sometimes implemented as a unilateralization network. The methods allow supply modulation and can improve backoff efficiency as compared to other designs. The stacked FETs in the power amplifiers naturally increase the loadline impedance to be a current source. Input power is split between the power amplifiers in the FIGS. 22-26 embodiments while the secondary amplifier is twice the size of the primary amplifier or even larger in some embodiments.

Figure 23:
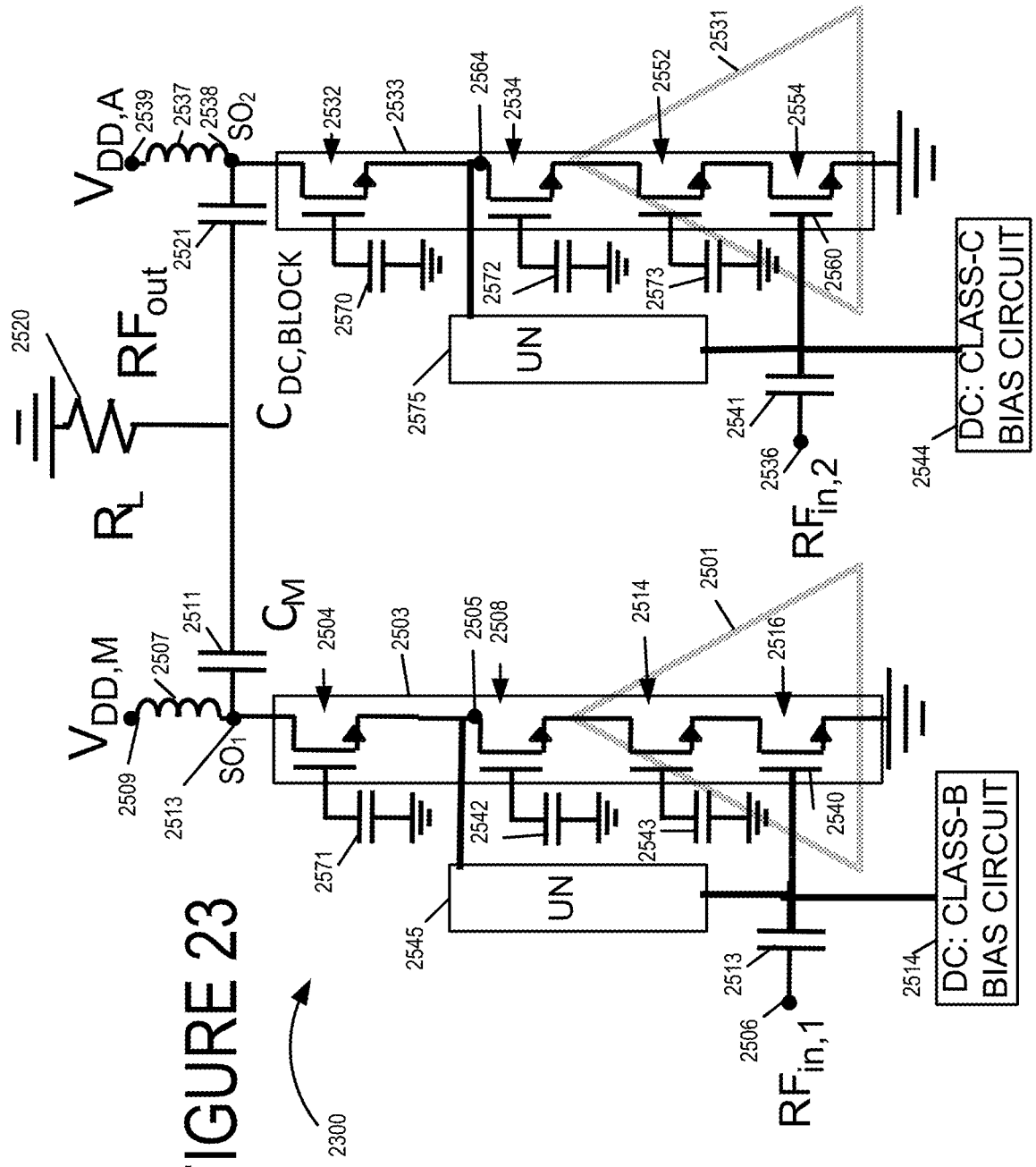
FIG. 23 shows a third exemplary amplifier implemented in accordance with the invention.

FIG. 23 shows a fourth exemplary amplifier 2300 implemented in accordance with the invention. The exemplary amplifier 2300 is similar to the one shown in FIG. 22 but includes a larger stack of transistors, e.g., 4 transistors, in each of the amplifiers 2501, 2531 and also includes in each of the primary and secondary amplifiers 2501, 2531 a unilateralization network 2545. In the case of the primary amplifier 2501, the unilateralization network 2545 is used and in the case of the secondary amplifier 2531 the unilateralization network 2575 is used.

The first stack of FETS 2503 included in the primary amplifier 2501 includes a first N-MOSFET 2516, a second N-MOSFET 2514, a third N-MOSFET 2508 and a fourth N-MOSFET 2504. The gates of the second, third and fourth N-MOSFETS are connected to ground through capacitors 2543, 2542 and 2540 respectively. The gate 2540 of the first N-MOSFET 2516 is coupled to the CLASS-B DC bias voltage source 2514 and is also coupled via DC blocking capacitor 2513 to the first RF signal input 2506. The drain of the last N-MOSFET 2504 in the first stack 2503 of FETs serves as the first signal output SO1 2513 and is coupled, via coupling capacitor CM 2511, to the load RL 2520 and further via DC blocking capacitor 2521 to the second signal output SO2 2538 of the secondary amplifier 2531. Series capacitor CM 2511 between the primary and secondary power amplifiers 2501, 2531 is used to realize a load modulation of the main amplifier impedance and in various embodiments is less than ⅓ the size of the DC blocking capacitor 2521 but in many embodiments less than ⅕ the size of the DC blocking capacitor 2521. In some embodiments the DC blocking capacitors 2521, 2513 and 2541 are each at least 3 times the size of CM 2511 but in some cases at least 5 times the size of CM 2511. In this way the DC blocking capacitors will block DC but pass the RF signal being amplified.

The secondary amplifier 2531 includes a stack of at least 4 N-MOSFETs 2554, 2552, 2534 and 2532. The second stack of FETs 2533 included in the secondary amplifier 2531 includes a first N-MOSFET 2554, a second N-MOSFET 2552, a third N-MOSFET 2534 and a fourth N-MOSFET 2532. The gates of the second, third, and fourth N-MOSFETS are connected to ground through capacitors 2573, 2572 and 2570, respectively. The gate of the first N-MOSFET 2554 is coupled to the CLASS-C DC bias voltage source 2544 and is also coupled via DC blocking capacitor 2541 to the second RF signal input 2536. Thus the second RF signal input is protected from the DC bias voltage but allows the second RF signal supplied to RF signal input 2536 to pass. The drain of the last N-MOSFET 2532 in the second stack 2533 of FETs is coupled to the second signal output SO2 2538.

The first signal output is coupled SO1 2513 is coupled to the voltage source VDD,M by the first inductor 2511 while the second signal output SO2 is coupled to voltage source 2539 VDD,A by second inductor 2527. The RF output signal current output by the primary and secondary amplifiers 2501, 2531 is supplied to load RL 2520 from the first and second outputs SO1, SO2 via capacitor CM 2511 and the blocking capacitor 2521, respectively with the separate DC voltage sources VDD,M 2509 and VDD,A 2539 being separated through the use of the capacitors.

Note that in the FIG. 23 embodiment the first unilateralization network 2545 spans across multiple transistors 2508, 2514 and extends from the drain of the third transistor 2505 to the gate 2540 of the first transistor 2516 in the first stack 2503 of transistors. Similarly the second unilateralization network 2575 spans across multiple transistors 2552, 2534 and extends from the drain 2564 of the third transistor 2532 to the gate 2560 of the first transistor 2554 in the second stack 2533 of transistors.

Figure 24:
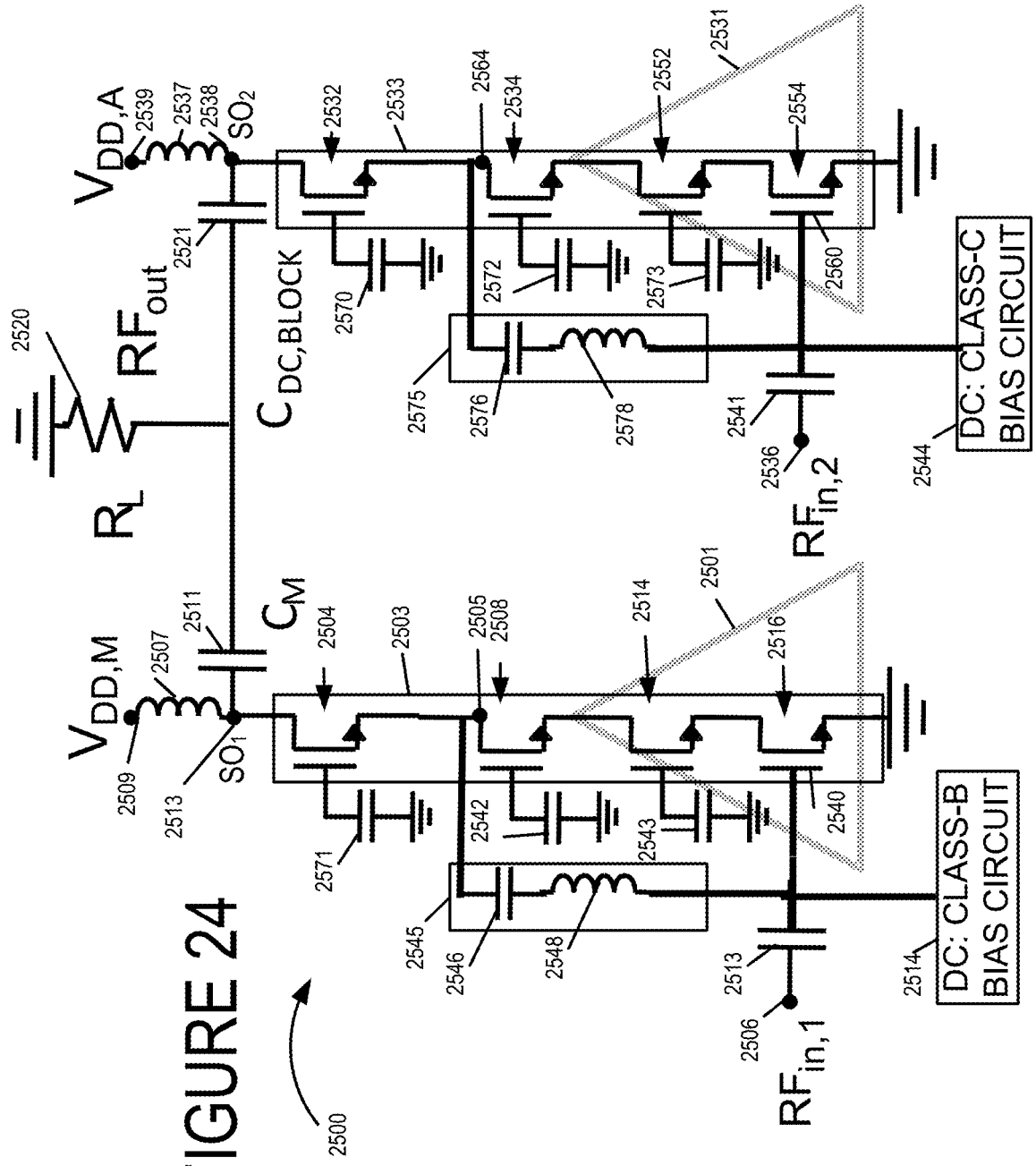
FIG. 24 shows a fourth exemplary amplifier implemented in accordance with the invention.

FIG. 24 shows an amplifier device 2500 which is the same as the one shown in FIG. 23 but with more detail provided with regard to the neutralization networks 2545, 2575. In the FIG. 24 exampled each of the first 2545 and second 2575 neutralization networks are implemented using a DC blocking capacitor in combination with an inductor. In particular in FIG. 24 the first neutralization network 2545 includes DC blocking capacitor 2546 and third inductor 2548. The second neutralization network 2575 includes DC blocking capacitor 2576 and fourth inductor 2578.

Figure 25:
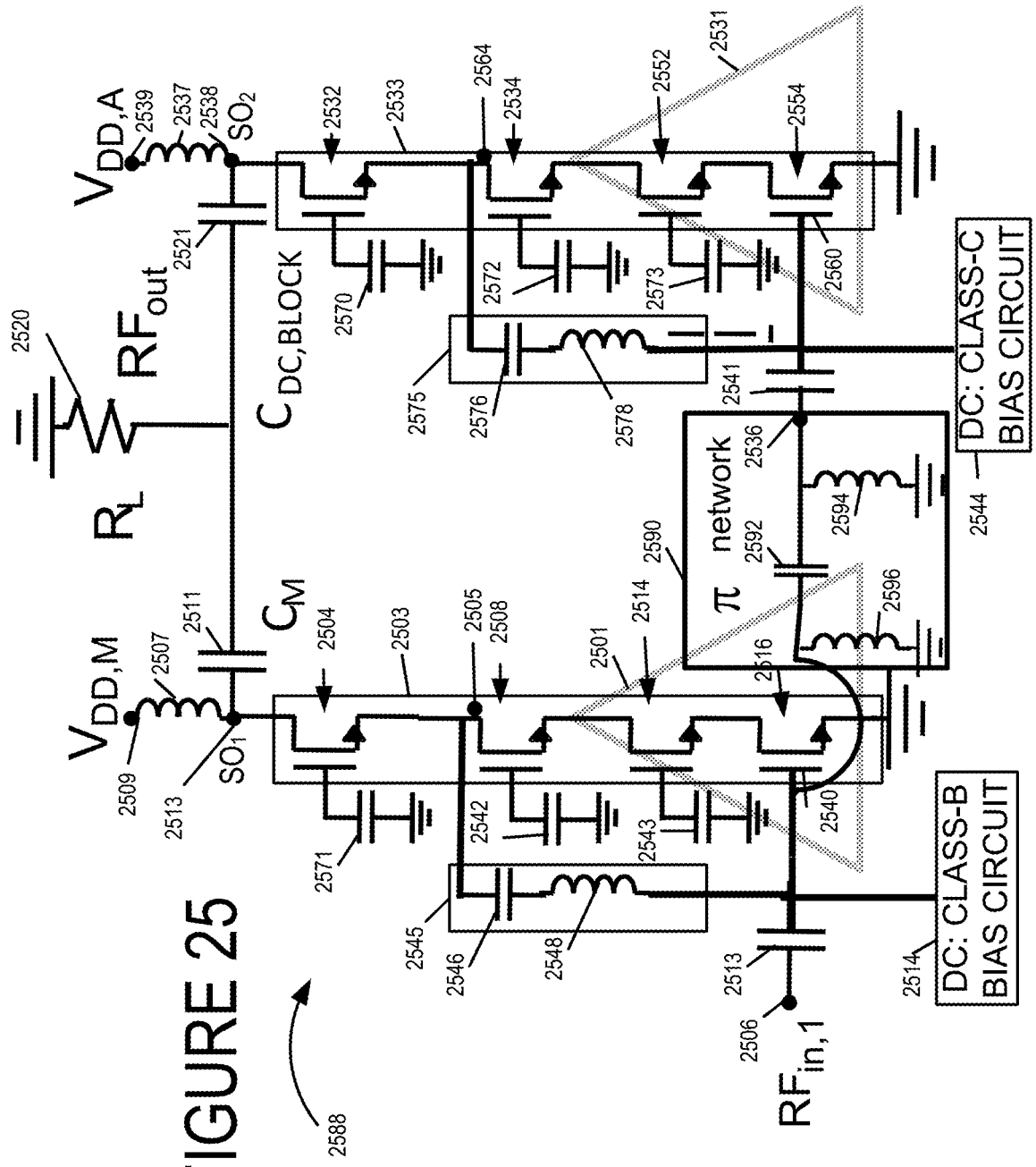
FIG. 25 shows a fifth exemplary amplifier in accordance with the invention.

FIG. 25 shows an amplifier device 2588 which is the same as the one shown in FIG. 24 but with a π network 2592 coupling the first RF signal input 2506 to the second RF signal input 2536. The π network 2592 includes two inductors 2596, 2594 connected to ground. The two inductors 2596 and 2594 are further coupled together by a capacitor 2592. The π network 2592 is used to apply a phase shift to the RFin,1 to generate the RFin,2. The introduced phase shift compensates for a phase shift introduced by one or both of the primary and secondary amplifiers so that the signals output by the two amplifiers are synchronized. The use of the πC network avoids the need for transmission lines to introduce phase or signal delays and is particularly well suited for CMOS implementations since it avoids the use of relatively large transmission lines to introduce phase or signal delay. Thus the FIG. 25 is particularly well suited for compact implementations requiring relatively small amounts of chip area as compared to embodiments where transmission lines are used as part of the amplifier device. The FIG. 25 embodiment which may be described as a current-combined, dual input power amplifier can address phase offset for large-signal compression mismatch through the use of the 3-port network 2590.

Figure 26:
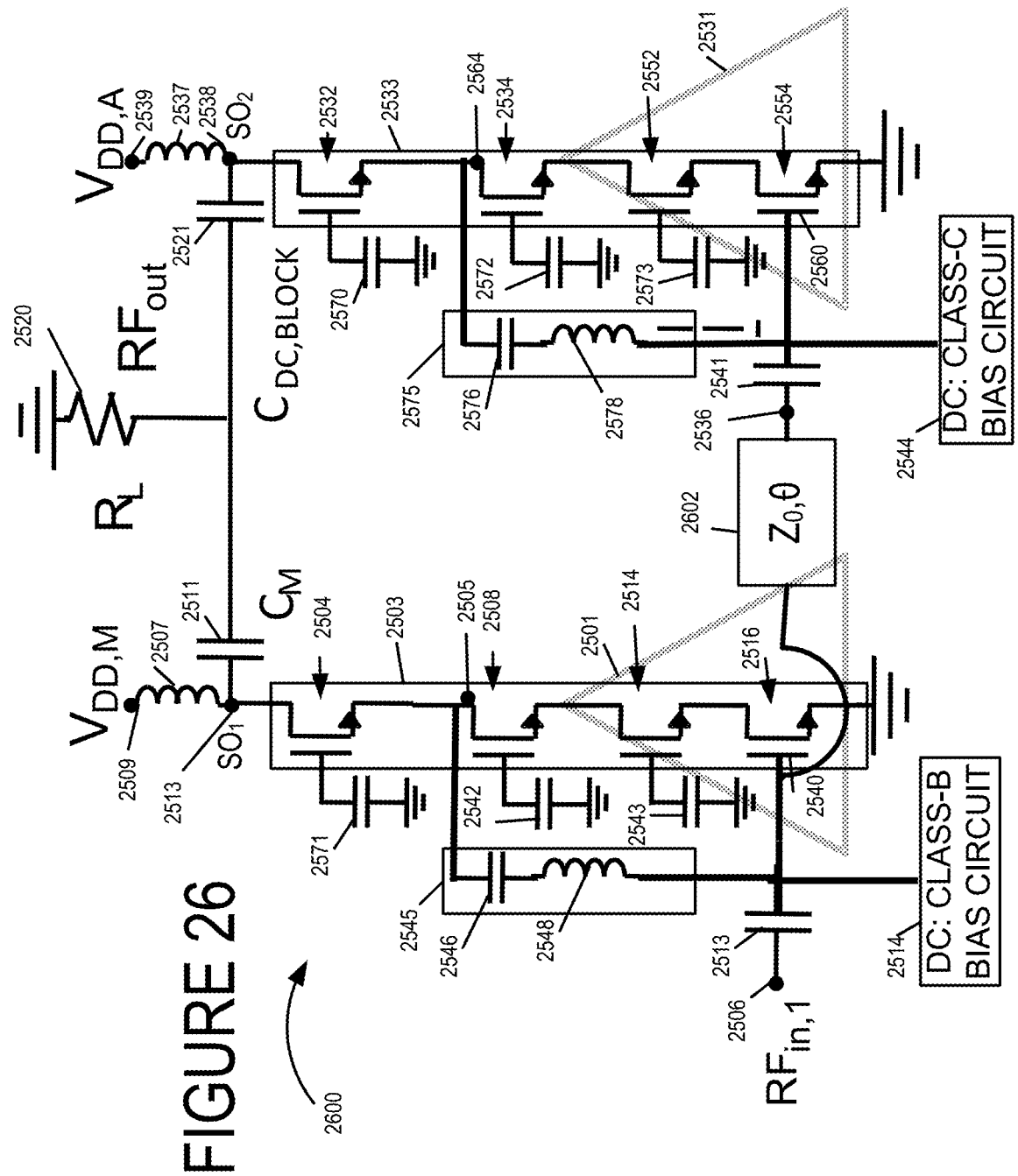
FIG. 26 shows a sixth exemplary amplifier implemented in accordance with the invention.

FIG. 26 shows an amplifier device 2600 which is similar to the one shown in FIG. 25 but in which a component 2600 including a transmission line is used to implement a phase shift. In the FIG. 26 network the transmission line component 2602 coupled the first RF signal input 2506 to the second RF signal input 2536 with the transmission line in component 2602 introducing a desired phase shift and/or signal delay into the first RF signal to produce the second RF input signal. As with the FIG. 25 embodiment the output of the primary and secondary amplifiers 2501 and 2531 will be synchronized. While the FIG. 26 embodiment includes a transmission line between the two amplifier inputs, it avoids the lossy and lengthy TL at the output of some of the known power amplifiers discussed in the background section of the application.

For some simulated embodiments 36% peak PAE and 27.9% 6-dB PAE are achieved in simulation results but there is no guarantee that all embodiments will produce such results.

The neutralization network is implemented in some embodiments as a unilaterization. The neutralization network is used in some embodiments to improve gain as compared to embodiments where such a network is not used. The number of transistors in each of the stacks can be increased and the number of transistors in each stack is exemplary and not intended to be limiting.

Numbered List of Exemplary Apparatus Embodiments

Apparatus Embodiment 1 A power amplification device (2100, 2200, 2300, 2500, 2588 or 2600) comprising: a primary power amplifier (2201 or 2501) including one or more field effect transistors (FETs) (2202, 2204 or 2504, 2508, 2514, 2516), said primary power amplifier (2201 or 2501) being a class AB power amplifier or a class-B power amplifier and having a first signal input (2206 or 2506) for receiving a first input signal (RFin,1) and a first signal output (SO1) (2213 or 2513) coupled to a load (RL) (2220 or 2520); and a secondary power amplifier (2208 or 2531) including one or more FETs (2232, 2234 or 2532, 2534, 2552, 2554), said secondary power amplifier (2208 or 2531) being a class-C power amplifier having a second signal input (2236 or 2536) for receiving a second input signal (RFin,2), a second signal output (SO2) (2238 or 2538) coupled to the load (2220 or 2520), said first signal output (SO1) (2213 or 2513) and said second signal output (SO2) (2238 or 2538) being coupled together.

Apparatus Embodiment 2 The power amplification device (2100, 2200, 2300, 2500, 2588 or 2600) of Apparatus Embodiment 1, wherein both said primary power amplifier (2201 or 2501) and secondary power amplifier (2208 or 2531) are coupled to a first DC voltage source (VDD) (2209 or 2509) by a first inductor (LM) (2208 or 2507) which is coupled to said first (SO1) signal output (2213 or 2513) and said second (2238 or 2538) signal output (SO2).

Apparatus Embodiment 3 The power amplification device (2100, 2200, 2300, 2500, 2588 or 2600) of Apparatus Embodiment 2, wherein the primary (2201 or 2501) power amplifier includes at least two N-MOSFETs (2202, 2204 or 2504, 2508, 2514, 2516) arranged in a first stack (2203 or 2503) and the secondary power amplifier (2208 or 2531)

also includes at least two N-MOSFETs (2232, 2234 or 2532, 2534, 2552, 2554)) arranged in a second stack (2233 or 2533).

Apparatus Embodiment 3A The power amplification device (2100, 2200, 2300, 2500, 2588 or 2600) of Apparatus Embodiment 3, wherein arranging the N-MOSFETs of the first power amplifier (2201 or 2501) in the first stack (2203 or 2503) combines power while increasing a loadline resistance of the first power amplifier (2201 or 2501) as compared to a case where fewer N-MOSFETs are used in the first stack (2203 or 2503).

Apparatus Embodiment 3B The power amplification device (2100, 2200, 2300, 2500, 2588 or 2600) of Apparatus Embodiment 3A, wherein arranging the N-MOSFETs of the second power amplifier (2208 or 2531) in a second stack (2233 or 2533) combines power while increasing the loadline resistance of the second power amplifier (2208 or 2531) as compared to a case where fewer N-MOSFETs were used in the second stack (2233 or 2533).

Apparatus Embodiment 4 The power amplification device (2100, 2200, 2300, 2500, 2588 or 2600) of Apparatus Embodiment 2, wherein the first signal input (2206 or 2506) receives a first RF signal and where the second signal input (2236 or 2536) receives a second RF signal, said second RF signal being different from said first RF signal in at least one of phase or amplitude.

Apparatus Embodiment 4.01 The power amplification device (2200, 2300, 2500, 2588 or 2600) of Apparatus Embodiment 1, wherein said first signal output (SO1) (2513) of the primary power amplifier (2501) is coupled to a first DC voltage source (VDD, M) (2509) by a first inductor (LM) (2507); and wherein the first signal output (SO1) (2513) is coupled to the load (2520) by a first coupling capacitor CM (2511).

Apparatus Embodiment 4A The power amplification device (2200, 2300, 2500, 2588 or 2600) of Apparatus Embodiment 4, wherein the first coupling capacitor CM (2511) is the simplest embodiment of a network that provides load modulation to the main amplifier (2501).

Apparatus Embodiment 4AA The power amplification device (2200, 2300, 2500, 2588 or 2600) of Apparatus Embodiment 4, wherein the secondary power amplifier (2531) is off when the power amplification device is operating in a low power mode of operation and on when operating in a high power mode of operation, the capacitance of the secondary power amplifier (2531) increasing by at least a factor of two when the secondary power amplifier turns on (note that in the case of being on or off a DC bias gate voltage is still supplied to one or more gates to FETS included in the secondary amplifier).

Apparatus Embodiment 4AAA The power amplification device (2200, 2300, 2500, 2588 or 2600) of Apparatus Embodiment 4AA, wherein the capacitance of the primary power amplifier (2501) remains substantially the same (e.g., remains within 10% of its maximum capacitance) when operating in both the low and high power modes of operation.

Apparatus Embodiment 4AAC The power amplification device (2200, 2300, 2500, 2588 or 2600) of Apparatus Embodiment 4AA, wherein during the high power mode of operation the capacitance of the secondary amplifier (2531) and inductance of the second inductor (LA) (2537) substantially cancel each other out (e.g., resonate within 20% of the natural frequency of the capacitance and inductance) at the operating frequency $\omega 0$.

Apparatus Embodiment 4B The power amplification device (2200, 2300, 2500, 2588 or 2600) of Apparatus Embodiment 4, wherein the capacitor CM (2511) in combination with capacitance of the secondary amplifier (2531) and inductance of the second inductor (LA) (2537) (capacitance of secondary amp in low power mode in combination with LA—form effective inductance which resonates with CM) resonate at a frequency $\omega 0$ when the power amplification device is in a low power mode of operation and the secondary amplifier (2531) is off, said frequency $\omega 0$ being the intended operating frequency of the power amplification device.

Apparatus Embodiment 4BB The power amplification device of Apparatus Embodiment 4B, wherein during the low power mode of operation the capacitor CM (2511) in combination with capacitance of the secondary amplifier (2531) resonates out at least 80% of the effective inductance of the second inductor (LA) (2537).

Apparatus Embodiment 4C The power amplification device (2200, 2300, 2500, 2588 or 2600) of Apparatus Embodiment 4, wherein said coupling capacitor CM (2511) provides a signal path for modulating the impedance seen by the output of the first power amplifier (2501) as the impedance of the secondary amplifier (2531) changes based on the amount of current supplied by the secondary amplifier (2531).

Apparatus Embodiment 5 The power amplification device (2200, 2300, 2500, 2588 or 2600) of Apparatus Embodiment 4, wherein said second signal output (SO2) (2538) of the secondary amplifier (2531) is coupled to a second supply voltage source (VDD, A) (2539) by a second inductor (LA) (2537); and wherein the second signal output (SO2) (2538) is coupled to the load (2520) by a first direct current (DC) blocking capacitor CDC,BLOCK (2521).

Apparatus Embodiment 5A The power amplification device (2200, 2300, 2500, 2588 or 2600) of Apparatus Embodiment 5, where the first DC blocking capacitor (2521) has a capacitance at least 3 times larger (but sometimes 5 time or more larger) than the first coupling capacitor CM (2511).

Apparatus Embodiment 6 The power amplification device (2200, 2300, 2500, 2588 or 2600) of Apparatus Embodiment 5, wherein the primary power amplifier (2501) includes a first stack (2503) of at least two N-MOSFETs (2505, 2508, 2514, 2516); wherein a gate (2540) of a first N-MOSFET (2516) of the first stack (2503) of at least two N-MOSFETs (2504, 2508, 2514, 2516) is coupled by a second DC blocking capacitor (2513) to the first RF signal input (2506) and to a DC class-B bias voltage source (2514).

Apparatus Embodiment 7 The power amplification device (2200, 2300, 2500, 2588 or 2600) of Apparatus Embodiment 6, wherein the secondary power amplifier (2531) includes a second stack (2533) of at least two N-MOSFETS (2532, 2534, 2552, 2554); and wherein a gate (2560) of a first N-MOSFET (2554) of the second stack (2533) of at least two N-MOSFETS (2532, 2534, 2552, 2554) is coupled by a third DC blocking capacitor (2541) to the second RF signal input (2536) and to a DC CLASS-C bias voltage source (2544).

Apparatus Embodiment 8 The power amplification device (2200, 2300, 2500, 2588 or 2600) of Apparatus Embodiment 6 further comprising: a first neutralization network (2545) coupled between a drain (2505) of one of the N-MOSFETS (2508) in the first stack (2503) of MOSFETS and the gate (2540) of the first N-MOSFET (2516) in the first stack (2503) of MOSFETS.

Apparatus Embodiment 8A The power amplification device (2200, 2300, 2500, 2588 or 2600) of Apparatus Embodiment 8, wherein the first neutralization network (2545) provides a signal feedback path across multiple FETS (2508, 2514) in the first stack (2503) of MOSFETS.

Apparatus Embodiment 8B The power amplification device (2200, 2300, 2500, 2588 or 2600) of Apparatus Embodiment 8A, wherein the first neutralization network (2545) is a unilateralization network.

Apparatus Embodiment 9 The power amplification device (2200, 2300, 2500, 2588 or 2600) of Apparatus Embodiment 8, wherein said first neutralization network (2545) includes a fourth DC blocking capacitor (2546) and a third inductor (2548).

Apparatus Embodiment 10 The power amplification device (2200, 2300, 2500, 2588 or 2600) of Apparatus Embodiment 9 further comprising: a second neutralization network (2575) coupled between a drain (2564) of one of the N-MOSFETS (2534) in the second stack (2533) of MOSFETS and the gate (2560) of the first N-MOSFET (2554) in the second stack (2533) of MOSFETS.

Apparatus Embodiment 10A The power amplification device (2200, 2300, 2500, 2588 or 2600) of Apparatus Embodiment 8, wherein the second neutralization network (2575) provides a signal feedback path across multiple MOSFETS (2534, 2552) in the second stack (2533) of MOSFETS.

Apparatus Embodiment 10B The power amplification device (2200, 2300, 2500, 2588 or 2600) of Apparatus Embodiment 10A, wherein the second neutralization network (2575) is designed to peak gain under high-power conditions when the second power amplifier (2531) is operating in an on state.

Apparatus Embodiment 11 The power amplification device (2200, 2300, 2500, 2588 or 2600) of Apparatus Embodiment 10, wherein said second neutralization network (2575) includes a fifth DC blocking capacitor (2576) and a fourth inductor (2578).

Apparatus Embodiment 12 The power amplification device (2588) of Apparatus Embodiment 7, further comprising: a capacitor and inductive network (2590) coupling the first signal input (2506) to the second signal input (2536), said capacitor and inductive network (2590) introducing at least a phase shift into a first RF signal received at the first RF signal input to produce a second RF signal supplied to the second RF signal input (2536).

The introduced phase shift is chosen in at least some embodiment based on a phase shift introduced in the output due to the modulation network (CM).

Apparatus Embodiment 12A The power amplification device (2588) of Apparatus Embodiment 12, wherein capacitor and inductive network (2590) is a Pi network.

Apparatus Embodiment 13 The power amplification device (2600) of Apparatus Embodiment 12, further comprising: a link (2602) including a transmission line coupling the first signal input (2506) to the second signal input (2536), said link (2602) introducing at least a phase shift into a first RF signal received at the first RF signal input (2506) to produce a second RF signal supplied to the second RF signal input (2536).

Apparatus Embodiment 14 The power amplification device of Apparatus Embodiment 1, wherein both the primary (2201 or 2501) and secondary power amplifier (2208 or 2531) operate in the same frequency range (e.g., where in some embodiments the frequency range is a 20 to 40 GHz frequency range).

Apparatus Embodiment 15 The power amplification device (2100, 2200, 2300, 2500, 2588 or 2600) of Apparatus Embodiment 1, wherein during a low power mode of operation, the primary power amplifier (2231 or 2531) is ON and the secondary power amplifier is OFF (but power is still supplied to the secondary power amplifier (2231 or 2531), e.g., the secondary power amplifier's gate are still supplied with the Class-C DC bias voltage but does not supply a significant amount of current to the load).

Apparatus Embodiment 16 The power amplification device (2100, 2200, 2300, 2500, 2588 or 2600) of Apparatus Embodiment 15, wherein during a high power mode of operation, both the primary power amplifier (2201 or 2501) is ON and the secondary power amplifier is ON (2208 or 2531) (e.g., supplying current to the load).

Apparatus Embodiment 17 The power amplification device (2200, 2300, 2500, 2588 or 2600) of Apparatus Embodiment 16, wherein during the high power mode of operation, LM (2507) resonates with capacitance of the primary amplifier (2501) and LA (2537) resonates with capacitance of the secondary amplifier (2531).

Apparatus Embodiment 18 The power amplification device (2200, 2300, 2500, 2588 or 2600) of Apparatus Embodiment 16, wherein during the high power mode of operation, a loadline resistance of the primary power amplifier (2501) is approximately the same as (e.g., within 20%) the loadline resistance of the secondary power amplifier (2531).

Apparatus Embodiment 19 The power amplification device (2200, 2300, 2500, 2588 or 2600) of Apparatus Embodiment 18, wherein the loadline resistance of the primary power amplifier (2501) during the high power mode of operation is approximately twice the resistance of the load (2520) (e.g., 2 RL).

Apparatus Embodiment 20 The power amplification device (2200, 2300, 2500, 2588 or 2600) of Apparatus Embodiment 15, wherein during the low power mode of operation, the loadline resistance of the primary power amplifier (2501) is approximately four times the resistance of the load (2520) (e.g., 4 RL or approximately 4 RL).

Numbered List of Exemplary Method Embodiments

Method Embodiment 1 An amplification method, the method comprising: supplying a first radio frequency signal to a first signal input (2206 or 2506) of a primary power amplifier (2201 or 2501), the primary power amplifier (2201 or 2501) including one or more field effect transistors (FETs) (2202, 2204 or 2504, 2508, 2514, 2516), said primary power amplifier (2201 or 2501) being a class AB power amplifier or a class-B power amplifier and having the first signal input (2206 or 2506) for receiving a first input signal (RFin,1) and a first signal output (SO1) (2213 or 2513) coupled to a load (RL) (2220 or 2520); and supplying a second radio frequency signal to a second signal input (2236 or 2536) of a secondary power amplifier (2208 or 2531), the secondary power amplifier (2208 or 2531) including one or more FETs (2232, 2234 or 2532, 2534, 2552, 2554), said secondary power amplifier (2208 or 2531) being a class-C power amplifier having a second signal input (2236 or 2536) for receiving a second input signal (RFin,2), a second signal output (SO2) (2238 or 2538) coupled to the load (2220 or 2520), said first signal output (SO1) (2213 or 2513) and said second signal output (SO2) (2238 or 2538) being coupled together.

Method Embodiment 2 The method of Method Embodiment 1, further comprising: performing at least a phase shifting operation on the first radio signal input to generate said second radio frequency signal from said first radio frequency signal.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps of the each of the described methods.

In various embodiments each of the steps or elements of a method are implemented using one or more processors. In some embodiments, each of elements or steps are implemented using hardware circuitry.

In various embodiments nodes and/or elements described herein are implemented using one or more components to perform the steps corresponding to one or more methods, for example, controlling, establishing, generating a message, message reception, signal processing, sending, communicating, e.g., receiving and transmitting, comparing, making a decision, selecting, making a determination, modifying, controlling determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., a SPI interface device, a chip, a device including an array of chips with using a common SPI interface bus, a wireless communications device including a multi-element antenna array supporting beam forming, such as a cellular AP or Wifi AP, a wireless terminal, a UE device, etc., including a processor configured to implement one, multiple or all of the steps of one or more methods of the invention.

In some embodiments, the processor or processors, e.g., CPUs, of one or more devices, are configured to perform the steps of the methods described as being performed by the devices, e.g., communication nodes. In some but not all embodiments a device, e.g., a wireless communications node such as an access point, base station or user device, includes one or more amplifier devices implemented in accordance with the invention. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g. one or more steps described above. Depending on the embodiment, the computer program product can, and sometimes does, include different code for each step to be performed. Thus, the computer program product may, and sometimes does, include code for each individual step of a method. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The amplifier device of the invention may be for use in, and part of, e.g., a chip or other circuit and may be and often is used in a wireless communications device.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A power amplification device comprising:
a primary power amplifier including one or more field effect transistors (FETs), said primary power amplifier being a class-AB power amplifier or a class-B power amplifier and having a first signal input for receiving a first radio frequency (RF) signal and a first signal output coupled to a load, said primary power amplifier including a first stack of at least two N-MOSFETs, a gate of a first N-MOSFET of the first stack of at least two N-MOSFETs being coupled by a second direct current (DC) blocking capacitor to the first signal input and to a DC class-B bias voltage source;
a secondary power amplifier including one or more additional FETs, said secondary power amplifier being a class-C power amplifier having a second signal input for receiving a second RF signal and a second signal output coupled to the load, said first signal output and said second signal output being coupled together, the second signal output being coupled to the load by a first DC blocking capacitor;
wherein the first signal input receives the first RF signal and wherein the second signal input receives the second RF signal, said second RF signal being different from said first RF signal in at least one of phase or amplitude; and
a first neutralization network coupled between a drain of one of the N-MOSFETs in the first stack of at least two N-MOSFETs and the gate of the first N-MOSFET in the first stack of at least two N-MOSFETs.

2. The power amplification device of claim 1, wherein both said primary power amplifier and said secondary power amplifier are coupled to a first DC voltage source by a first inductor which is coupled to said first signal output and said second signal output.

3. The power amplification device of claim 2, wherein the secondary power amplifier also includes at least two N-MOSFETs arranged in a second stack.

4. The power amplification device of claim 2,
wherein said second signal output of the secondary power amplifier is coupled to a second supply voltage source by a second inductor.

5. The power amplification device of claim 4,
wherein the secondary power amplifier includes a second stack of at least two N-MOSFETs; and
wherein a gate of a first N-MOSFET of the second stack of at least two N-MOSFETs is coupled by a third DC blocking capacitor to the second signal input and to a DC class-C bias voltage source.

6. The power amplification device of claim 5, wherein said first neutralization network includes a fourth DC blocking capacitor and a third inductor.

7. The power amplification device of claim 6, further comprising:
a second neutralization network coupled between a drain of one of the N-MOSFETs in the second stack of at least two N-MOSFETs and the gate of the first N-MOSFET in the second stack of at least two N-MOSFETs.

8. The power amplification device of claim 7, wherein said second neutralization network includes a fifth DC blocking capacitor and a fourth inductor.

9. The power amplification device of claim 5, further comprising:
a capacitor and inductive network coupling the first signal input to the second signal input, said capacitor and inductive network introducing at least a phase shift into the first RF signal received at the first signal input to produce the second RF signal supplied to the second signal input.

10. The power amplification device of claim 5, further comprising:
a link including a transmission line coupling the first signal input to the second signal input, said link introducing at least a phase shift into the first RF signal received at the first signal input to produce the second RF signal supplied to the second signal input.

11. The power amplification device of claim 1, wherein both the primary power amplifier and the secondary power amplifier operate in the same frequency range.

12. The power amplification device of claim 1, wherein during a low power mode of operation, the primary power amplifier is ON and the secondary power amplifier is OFF.

13. The power amplification device of claim 12, wherein during a high power mode of operation, both the primary power amplifier is ON and the secondary power amplifier is ON.

14. A power amplification device comprising:
a primary power amplifier including one or more field effect transistors (FETs), said primary power amplifier being a class-AB power amplifier or a class-B power amplifier and having a first signal input for receiving a first radio frequency (RF) signal and a first signal output coupled to a load; and
a secondary power amplifier including one or more additional FETs, said secondary power amplifier being a class-C power amplifier having a second signal input for receiving a second RF signal and a second signal output coupled to the load, said first signal output and said second signal output being coupled together;
wherein during a low power mode of operation, the primary power amplifier is ON and the secondary power amplifier is OFF;
wherein during a high power mode of operation, both the primary power amplifier is ON and the secondary power amplifier is ON; and
wherein during the high power mode of operation, a first inductor coupled to the output of the primary power amplifier resonates with capacitance of the primary power amplifier and a second inductor coupled to the output of the secondary power amplifier resonates with capacitance of the secondary power amplifier.

15. The power amplification device of claim 13, wherein during the high power mode of operation, a loadline resistance of the primary power amplifier is approximately the same as the loadline resistance of the secondary power amplifier.

16. An amplification method, the method comprising:
supplying a first radio frequency (RF) signal to a first signal input of a primary power amplifier, the primary power amplifier including one or more field effect transistors (FETs), said primary power amplifier being a class-AB power amplifier or a class-B power amplifier and having a first signal input for receiving a first RF signal and a first signal output coupled to a load, said primary power amplifier including a first stack of at least two N-MOSFETs, a gate of a first N-MOSFET of the first stack of at least two N-MOSFETs being coupled by a second direct current (DC) blocking capacitor to the first signal input and to a DC class-B bias voltage source;
supplying a second RF signal to a second signal input of a secondary power amplifier, the secondary power amplifier including one or more additional FETs, said secondary power amplifier being a class-C power amplifier having a second signal input for receiving a second RF signal and a second signal output coupled to the load, said first signal output and said second signal output being coupled together, the second signal output being coupled to the load by a first DC blocking capacitor;
operating a first neutralization network to couple a drain of one of the N-MOSFETS in the first stack of at least two N-MOSFETs and the gate of the first N-MOSFET in the first stack of at least two N-MOSFETS; and
wherein the first RF signal the second RF signal are different in at least one of phase or amplitude.

17. The method of claim 16, further comprising:
performing at least a phase shifting operation on the first RF signal to generate said second RF signal from said first RF signal.

* * * * *